US010403641B2

(12) United States Patent
Kim et al.

(10) Patent No.: US 10,403,641 B2
(45) Date of Patent: Sep. 3, 2019

(54) SEMICONDUCTOR DEVICES

(71) Applicant: SAMSUNG ELECTRONICS CO., LTD., Suwon-si (KR)

(72) Inventors: Sung-Gil Kim, Yongin-si (KR); Seul-Ye Kim, Seoul (KR); Hong-suk Kim, Yongin-si (KR); Phil-Ouk Nam, Suwon-si (KR); Jae-Young Ahn, Seongnam-si (KR); Ji-Hoon Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/987,545

(22) Filed: May 23, 2018

(65) Prior Publication Data
US 2019/0006385 A1    Jan. 3, 2019

(30) Foreign Application Priority Data
Jul. 3, 2017 (KR) .................. 10-2017-0084229

(51) Int. Cl.
*H01L 29/792* (2006.01)
*H01L 27/11582* (2017.01)
*H01L 27/11556* (2017.01)
*H01L 21/768* (2006.01)
*H01L 21/311* (2006.01)

(52) U.S. Cl.
CPC ... *H01L 27/11582* (2013.01); *H01L 21/31111* (2013.01); *H01L 21/7685* (2013.01); *H01L 21/76843* (2013.01); *H01L 21/76877* (2013.01); *H01L 27/11556* (2013.01)

(58) Field of Classification Search
CPC ......... H01L 27/11582; H01L 27/11556; H01L 21/31111; H01L 21/76843; H01L 21/7685; H01L 21/76877
USPC ........................................................ 257/324
See application file for complete search history.

(56) References Cited

U.S. PATENT DOCUMENTS

| | | | |
|---|---|---|---|
| 9,202,780 B2 | 12/2015 | Lee et al. | |
| 9,331,082 B2 | 3/2016 | Lee et al. | |
| 9,356,038 B2 | 3/2016 | Lee et al. | |
| 9,343,452 B2 | 5/2016 | Yun et al. | |
| 9,373,540 B2 | 6/2016 | Hyun | |
| 9,478,487 B2 | 10/2016 | Yang et al. | |
| 2016/0336330 A1* | 11/2016 | Masuoka | H01L 27/115 |

(Continued)

FOREIGN PATENT DOCUMENTS

| | | |
|---|---|---|
| KR | 10-2009-0022228 A | 3/2009 |
| KR | 10-2015-0051841 A | 5/2015 |

*Primary Examiner* — Tu-Tu V Ho
(74) *Attorney, Agent, or Firm* — Sughrue Mion, PLLC

(57) ABSTRACT

A semiconductor device may include a plurality of conductive patterns and an insulation pattern. The plurality of conductive patterns may be formed on a substrate. The plurality of conductive patterns may be spaced apart from each other in a vertical direction perpendicular to an upper surface of the substrate. Each of the plurality of conductive patterns may have an extension portion and a step portion. The step portion may be disposed at an edge of the corresponding conductive pattern. The insulation pattern may be formed between the plurality of conductive patterns in the vertical direction. A lower surface and an upper surface of the step portion of each of the plurality of conductive patterns may be bent upwardly.

19 Claims, 27 Drawing Sheets

(56) References Cited

U.S. PATENT DOCUMENTS

2017/0084532 A1 3/2017 Son et al.
2018/0366453 A1* 12/2018 Carlson ................ H01L 25/105

* cited by examiner

SEMICONDUCTOR DEVICES

CROSS-REFERENCE TO RELATED APPLICATION

This application claims priority under 35 U.S.C. § 119 from Korean Patent Application No. 10-2017-0084229, filed on Jul. 3, 2017, in the Korean Intellectual Property Office, the contents of which are incorporated herein by reference in their entirety.

BACKGROUND

1. Field

Example embodiments relate to semiconductor devices. More particularly, example embodiments relate to vertical memory devices.

2. Description of the Related Art

A vertical memory device that includes a plurality of memory cells vertically stacked at a plurality of levels, respectively, on a substrate has been developed. The memory cells may include stacked conductive lines, and edge upper surfaces of the conductive lines may serve as pad regions, respectively. The pad regions may have a staircase shape. As a vertical distance between stacked memory cells may be reduced, formation of the pad regions that have a staircase shape may become increasingly difficult.

SUMMARY

Example embodiments provide a semiconductor device that has pad regions.

According to example embodiments, there is provided a semiconductor device that may include a plurality of conductive patterns and an insulation pattern. The plurality of conductive patterns may be formed on a substrate. The conductive pattern structure may be arranged such that each of the conductive patterns is spaced apart from each other in a vertical direction that is perpendicular to an upper surface of the substrate. Each of the plurality of conductive patterns may have an extension portion and a step portion. The step portion may be disposed at an edge of a corresponding one of the plurality of conductive patterns. The insulation pattern may be formed between each of the plurality of conductive patterns in the vertical direction. A lower surface of the step portion and an upper surface of the step portion of each of the plurality of conductive patterns may be bent upwardly.

According to example embodiments, there is provided a semiconductor device that may include a conductive pattern structure and a pad structure. The conductive pattern structure may be disposed on a first region of a substrate. The conductive pattern structure may include first conductive patterns and first insulation patterns that are alternatingly and repeatedly stacked. The pad structure may be disposed on a second region of the substrate. The pad structure may include second conductive patterns and second insulation patterns that are alternatingly and repeatedly stacked. The first conductive patterns and the second conductive patterns in each level may have a single first structure, and the first insulation patterns and the second insulation patterns in each level may have a single second structure. Each of the second conductive patterns may include an extension portion and a step portion, and the step portion may be disposed at an edge of a corresponding one of the second conductive patterns. The extension portion of each of the second conductive patterns may have a first lower surface that is substantially flat and a first upper surface that is substantially flat, and the step portion has a second lower surface that may be bent upwardly and a second upper surface that may be bent upwardly.

According to example embodiments, there is provided a semiconductor device that may include a conductive pattern structure, a plurality of channel structures and a pad structure. The conductive pattern structure may be disposed on a first region of a substrate. The conductive pattern structure may include first conductive patterns and first insulation patterns that are alternatingly and repeatedly stacked. The plurality of channel structures may be disposed on the substrate and extending through the conductive pattern structure. A pad structure may be disposed on a second region of the substrate. The pad structure may include second conductive patterns and second insulation patterns that are alternatingly and repeatedly stacked. The first conductive patterns and the second conductive patterns in each level may have a single first structure, and the first insulation patterns and the second insulation patterns in each level may have a single second structure. Each of the second conductive patterns may include an extension portion and a step portion, and each of a lower surface and an upper surface of an edge portion of the step portion may be bent upwardly.

In example embodiments, each of the conductive patterns in the pad structure may be bent upwardly. A distance between neighboring conductive patterns in the vertical direction may increase due to the bent portions, and thus a probability of an electrical short circuit between the neighboring conductive patterns in the vertical direction may decrease.

BRIEF DESCRIPTION OF THE DRAWINGS

Example embodiments will be more clearly understood from the following detailed description taken in conjunction with the accompanying drawings, in which.

DETAILED DESCRIPTION

Figure 1:
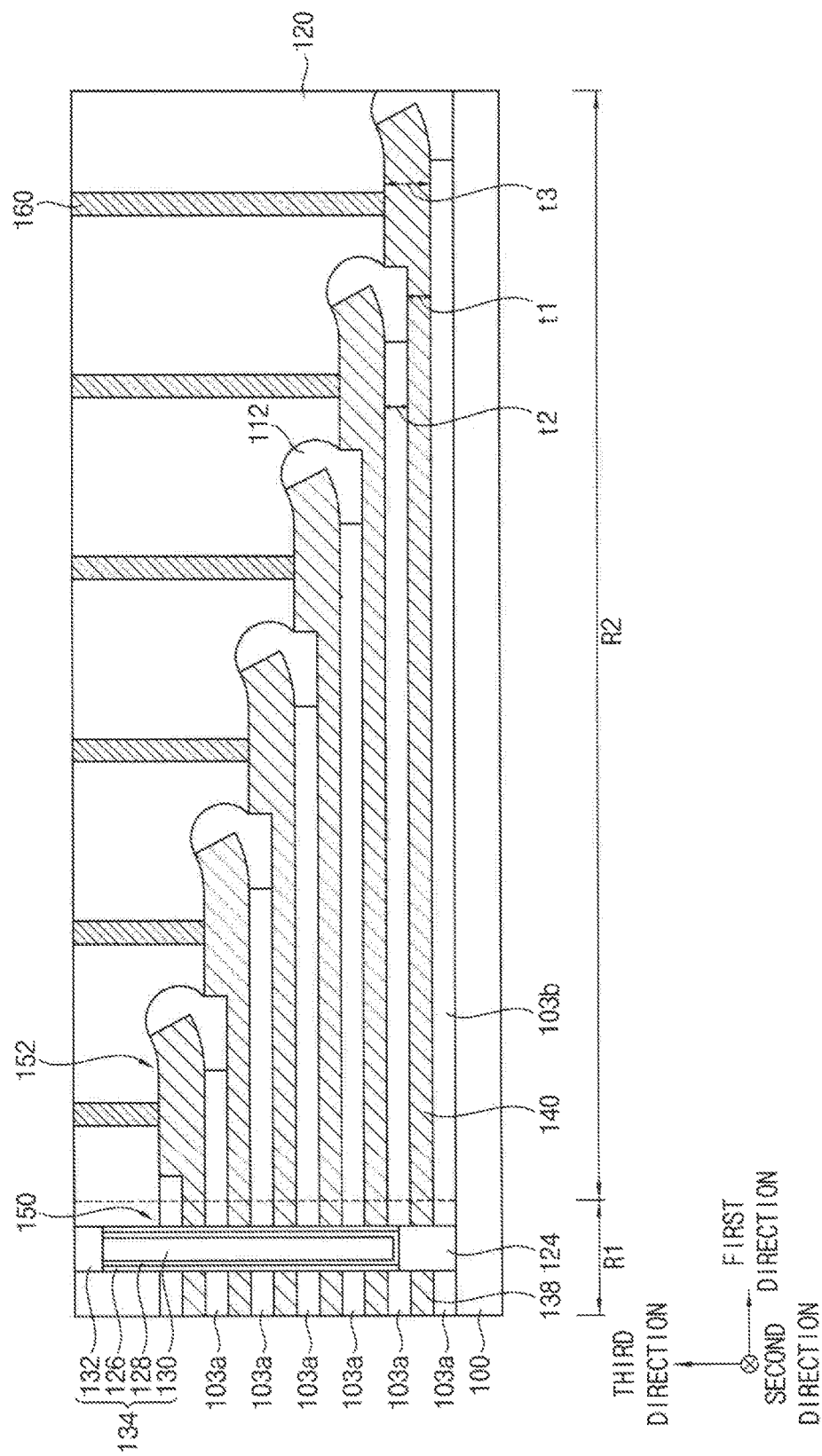
FIG. 1 is a cross-sectional view illustrating a semiconductor device, in accordance with example embodiments.
Figure 2:
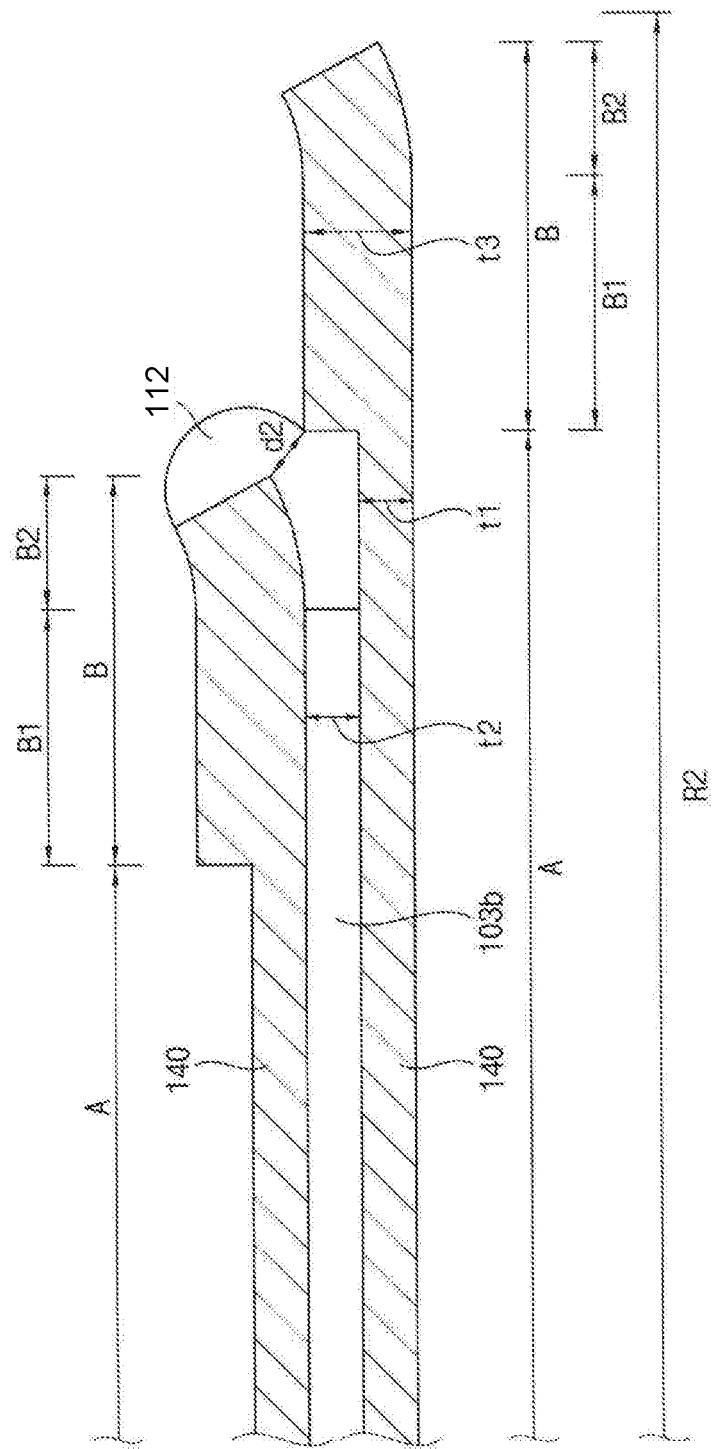
FIG. 2 is a cross-sectional view illustrating a portion of a pad structure in the semiconductor device.

FIG. 1 is a cross-sectional view illustrating a semiconductor device, in accordance with example embodiments. FIG. 2 is a cross-sectional view illustrating a portion of a pad structure in the semiconductor device.

Referring to FIGS. 1 and 2, a substrate 100 may include a first region R1 on which memory cells may be formed in three dimensions and a second region R2 on which wirings connected with the memory cells may be formed. In example embodiments, the second region R2 may be adjacent to an edge of the first region R1 in a first direction.

A conductive pattern structure 150 and a channel structure 134 may be formed on the first region R1. A pad structure 152 that is in contact with sidewalls of the conductive pattern structure 150 may be formed on the second region R2. The pad structure 152 may have a staircase or stepped shape. The conductive pattern structure 150 and the channel structure 134 may function as a plurality of memory cells. The pad structure 152 may be connected to wirings configured for supplying electrical signals to the conductive pattern structure 150.

The substrate 100 may include a semiconductor material. The substrate 100 may include, e.g., a silicon substrate, a germanium substrate or a silicon-germanium substrate.

Hereinafter, the conductive pattern structure 150 formed on the first region R1 will be described.

The conductive pattern structure 150 may include first conductive patterns 138 and first insulation patterns 103a that are alternatingly and repeatedly stacked. In this aspect, the first conductive patterns 138 may be spaced apart from each other in a third direction that is substantially perpendicular to an upper surface of the substrate 100.

Upper surfaces and lower surfaces of the first conductive patterns 138 and the first insulation patterns 103a may be substantially flat. In particular, the upper surfaces and the lower surfaces of the first conductive patterns 138 and the first insulation patterns 103a may be substantially parallel with the upper surface of the substrate 100.

Each of the first conductive patterns 138 may have a first thickness t1 in the third direction. Each of the first insulation patterns 103a may have a second thickness t2 in the third direction.

The conductive pattern structure 150 may extend in the first direction. In example embodiments, a plurality of conductive pattern structures 150 may be spaced apart from each other in a second direction that is substantially perpendicular to the first direction.

The first conductive patterns 138 may include a ground selection line (GSL), a string selection line (SSL), and a plurality of word lines disposed between the GSL and SSL.

The first conductive pattern 138 may include a metal. In example embodiments, the first conductive pattern 138 may include a metal pattern and a barrier pattern. The metal pattern may include, e.g., any one or more of tungsten, copper, cobalt, aluminum, etc., and the barrier pattern may include, e.g., any one or more of titanium, titanium nitride, tantalum, tantalum nitride, etc.

Hereinafter, the pad structure 152 formed on the second region R2 will be described.

The pad structure 152 may contact each of opposite edges of the conductive pattern structure 150 in the first direction. In this aspect, the conductive pattern structure 150 and the pad structure 152 may be integrally formed, and may constitute a single body that extends in the first direction.

In particular, the pad structure 152 may include second conductive patterns 140 and second insulation patterns 103b that are alternatingly and repeatedly stacked. In this aspect, the second conductive patterns 140 and the first conductive patterns 138 may be integrally formed, and may constitute a single body that includes substantially the same material. In addition, the second insulation patterns 103b and the first insulation patterns 103a may be integrally formed, and may constitute a single body that includes substantially the same material.

In example embodiments, the pad structure 152 may have a staircase shape in the first direction. In particular, edge portions of the second conductive patterns 140 may be arranged so as to have a staircase shape.

The second conductive patterns 140 may have different lengths in the first direction according to respective levels thereof. Each of the second conductive patterns 140 may include an extension portion A and a step portion B. An edge of the extension portion A of each of the second conductive patterns 140 may contact a sidewall of a corresponding one of the first conductive patterns 138 in the conductive pattern structure 150.

In example embodiments, a thickness in the third direction of the extension portion A may be different from a thickness in the third direction of the step portion B, in the second conductive pattern 140. The extension portion A may have the first thickness t1 in the third direction. The step portion B may have a third thickness t3 in the third direction that is greater than the first thickness t1. The step portion B of each of the second conductive patterns 140 may not overlap with ones of the second conductive patterns 140 that are adjacent thereto in the third direction.

In example embodiments, an upper surface and a lower surface of each of the extension portions A may be substantially flat. Thus, an upper surface and a lower surface of the second insulation pattern 103b that is disposed between the extension portions A may be also substantially flat.

In example embodiments, the step portion B may have a first portion B1 having a lower surface that is substantially flat and a second portion B2 having a lower surface that is bent upwardly. In the second portion B2, the lower surface and an upper surface of the second conductive pattern 140 may not be flat, but may instead be bent upwardly.

The lower surface of the first portion B1 may be supported by the second insulation pattern 103b. The lower surface and a sidewall of the second portion B2 may be supported by a silicon oxide layer 112. In example embodiments, the silicon oxide layer 112 may fill a recess between one of the second conductive patterns 140 and the second portion B2 of an adjacent one of the second conductive patterns 140 thereover.

In example embodiments, a second distance d2 between an end portion of the second portion B2 of one of the second conductive patterns 140 and the step portion B of an adjacent one of the second conductive patterns 140 therebelow may be greater than the second thickness t2 of the second insulation pattern 103b. As the upper surface and the lower surface of the second portion B2 are bent upwardly at a relatively wide angle, or the length in the first direction of the second portion B2 increases, the second distance d2 may increase. When the second distance d2 is increased, a probability of an occurrence of an electrical short circuit between the second conductive patterns 140 in the pad structure 152 may decrease.

In example embodiments, the third thickness t3 of the second portion B2 may be equal to or greater than a sum of the first thickness t1 and the second thickness t2. According to the bending degree of the upper and lower surfaces of the second portion B2 and the length of the second portion B2, the electrical short circuit between the second conductive patterns 140 in the pad structure 152 may not occur.

In some example embodiments, the third thickness t3 of the second portion B may be less than the sum of the first thickness t1 and the second thickness t2.

An upper insulating interlayer 120 may be disposed so as to cover the conductive pattern structure 150 and the pad structure 152. An upper surface of the upper insulating interlayer 120 may be substantially flat. Thus, a thickness of a portion of the upper insulating interlayer 129 on the pad structure 152 may be greater than a thickness of a portion of the upper insulating interlayer 120 on the conductive pattern structure 150.

The channel structure 134 may extend through the conductive pattern structure 150 and the upper insulating interlayer 120, and may have a pillar shape. A dummy channel structure (not shown) may extend through the upper insulating interlayer 120 and the pad structure 152.

In example embodiments, a semiconductor pattern 124 may be formed between the substrate 100 and the channel structure 134. In this case, each of the channel structure 134 may be formed on the semiconductor pattern 124. In some example embodiments, the channel structure 134 may be in direct physical contact with the substrate 100.

In example embodiments, the channel structure 134 may include a dielectric structure 126, a channel 128, a filling insulation pattern 130 and an upper conductive pattern 132. In example embodiments, the channel 128 may have a hollow cylindrical shape or a cup-like shape. The channel 128 may include polysilicon or single crystalline silicon. A portion of the channel 128 may be doped with p-type impurities, such as, for example, boron. The filling insulation pattern 130 may be formed on the channel 128 so as to fill an inner space of the channel 128. The filling insulation pattern 130 may include an insulation material, such as, for example, silicon oxide. In some example embodiments, the channel 128 may have a solid cylindrical shape or a pillar shape, and in this case, the filling insulation pattern 130 may not be formed. The dielectric structure 126 may surround an outer sidewall of the channel 128. The dielectric structure 126 may include a tunnel insulation layer, a charge storage layer and a blocking dielectric layer which are sequentially stacked on the outer sidewall of the channel 128. The blocking dielectric layer may include an oxide, such as, for example, silicon oxide, or a metal oxide, such as, for example, hafnium oxide, aluminum oxide, etc. The charge storage layer may include a nitride, such as, for example, silicon nitride, or a metal oxide. The tunnel insulation layer may include an oxide, such as, for example, silicon oxide. The upper conductive pattern 132 may include, for example, polysilicon.

The semiconductor pattern 124 may include, for example, polysilicon or single crystalline silicon.

The contact plug 160 may contact the pad structure 152, and may extend through the upper insulating interlayer 120. In example embodiments, the contact plug 160 may be formed on the first portion B1 of the step portion B. In example embodiments, the contact plug 160 may include a barrier metal pattern and a metal pattern.

A wiring line (not shown) may be formed on the contact plug 160.

Figure 3:
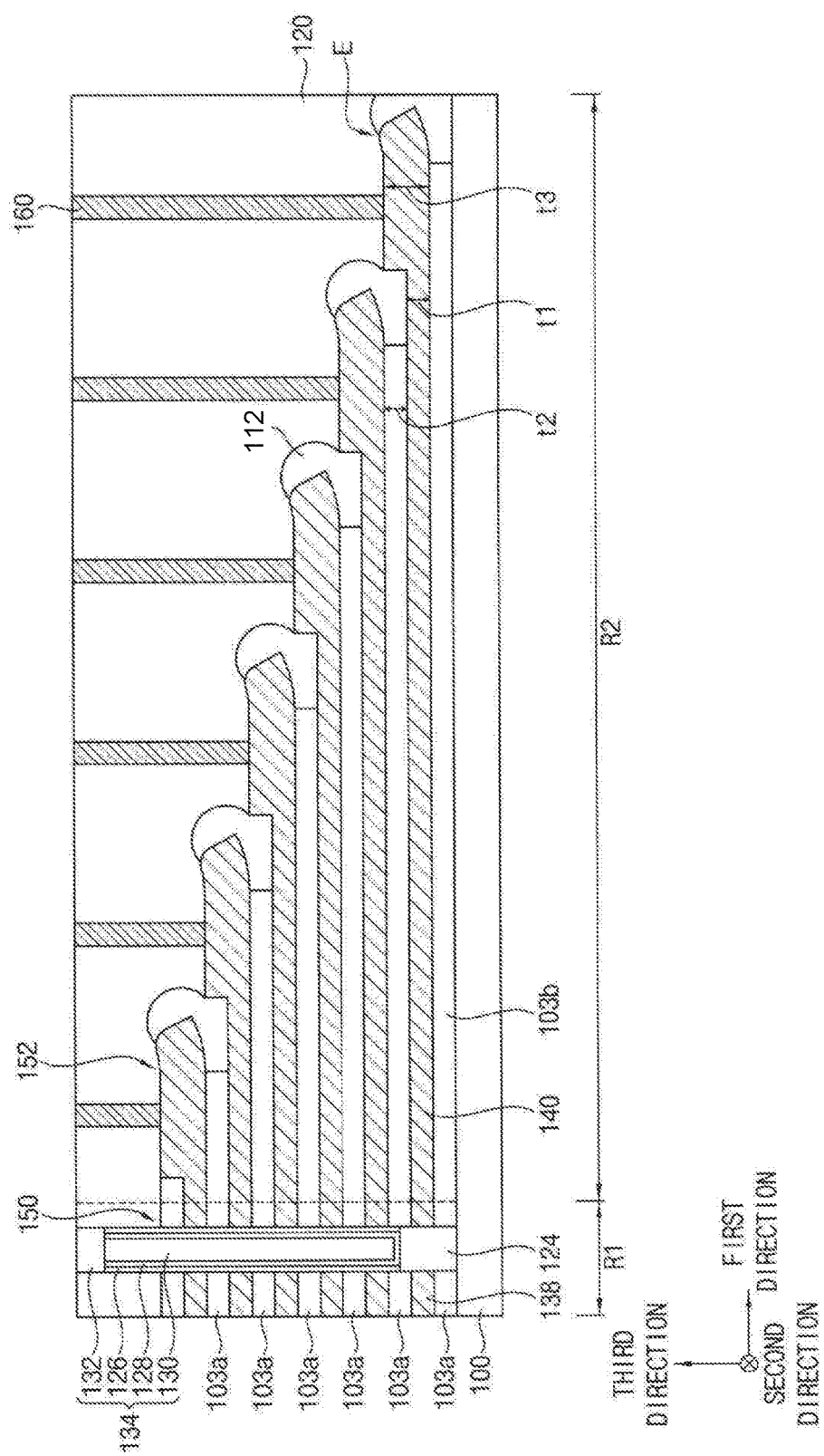
FIG. 3 is a cross-sectional view illustrating a semiconductor device, in accordance with example embodiments

FIG. 3 is a cross-sectional view illustrating a semiconductor device, in accordance with example embodiments.

The semiconductor device of FIG. 3 may be substantially the same as the semiconductor device illustrated in FIGS. 1 and 2, except for an edge portion of the second conductive pattern in the pad structure.

Referring to FIG. 3, the second conductive pattern 140 may include the step portion B (referring to FIG. 2) and the extension portion A (referring to FIG. 2). The step portion B may have the third thickness t3 that is greater than a thickness of the extension portion A. The step portion B may include the first portion B1 having a lower surface that is substantially flat and the second portion B2 having a lower surface that is bent upwardly. An edge of an upper surface of the second portion B2 may be curved downward, and thus an edge portion of the second portion B2 may be relatively thin.

FIGS. 4 to 18 are cross-sectional views and plan views illustrating stages of a method of manufacturing a semiconductor device, in accordance with example embodiments.

Figure 11:
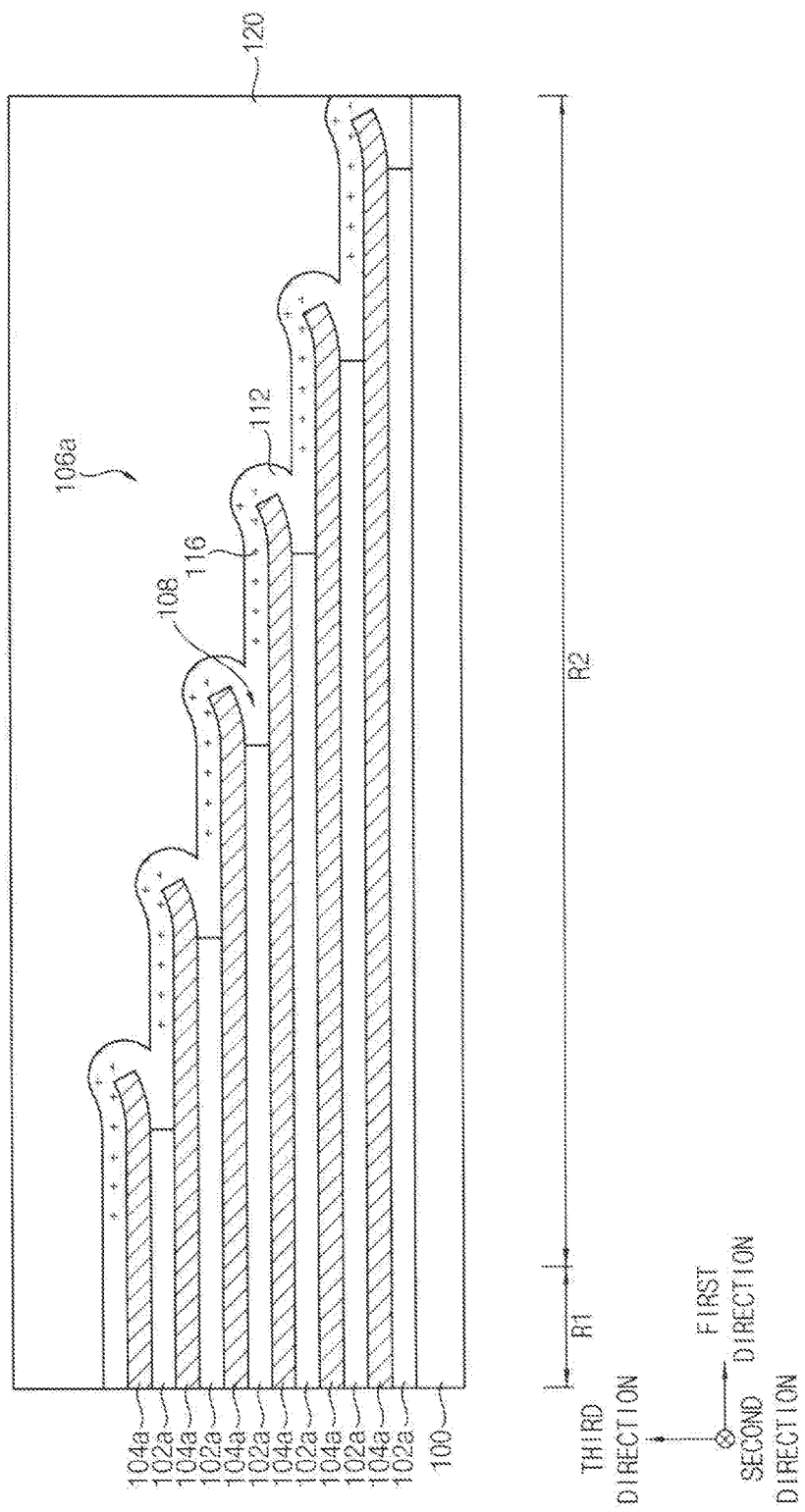
Figure 12:
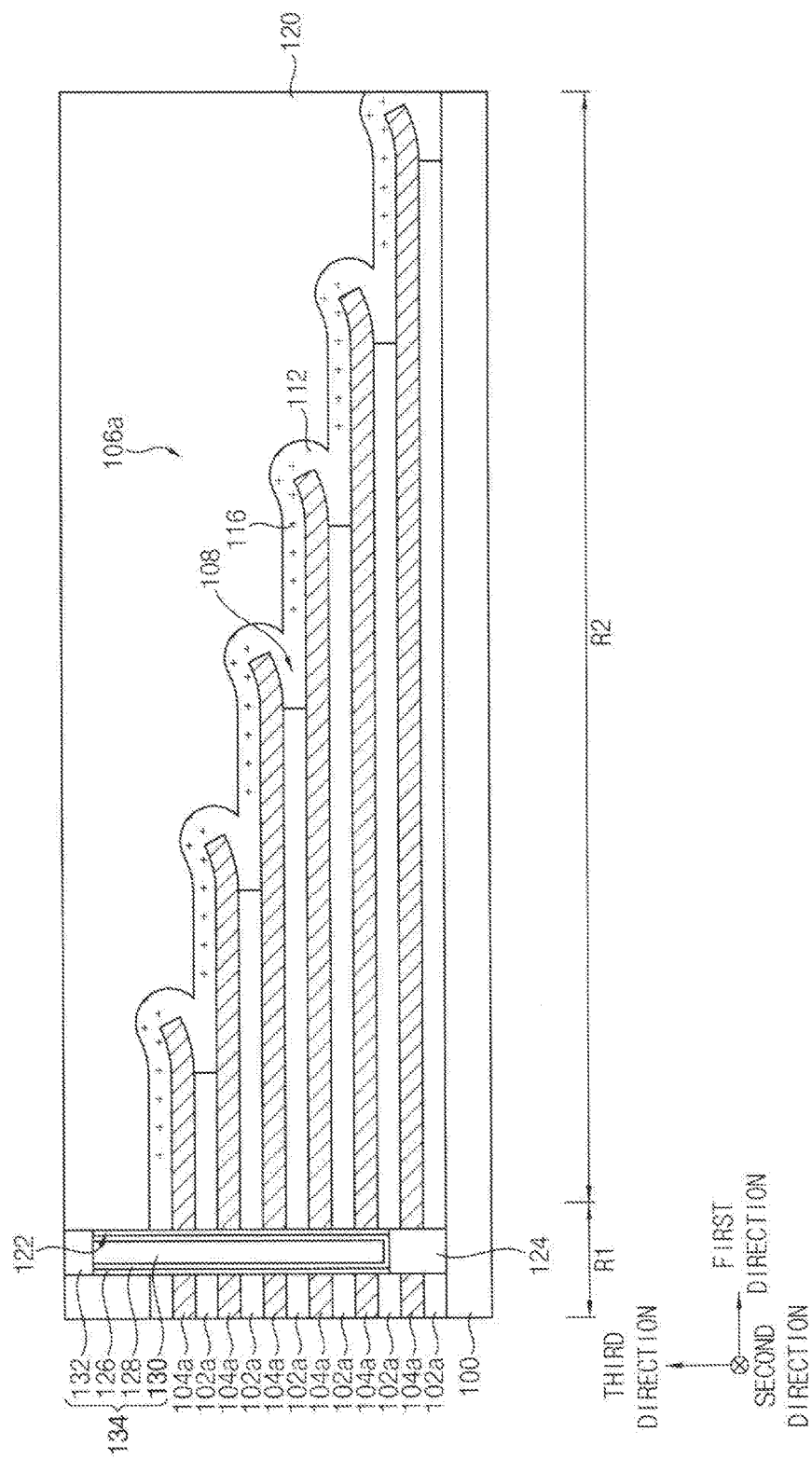
Figure 13:
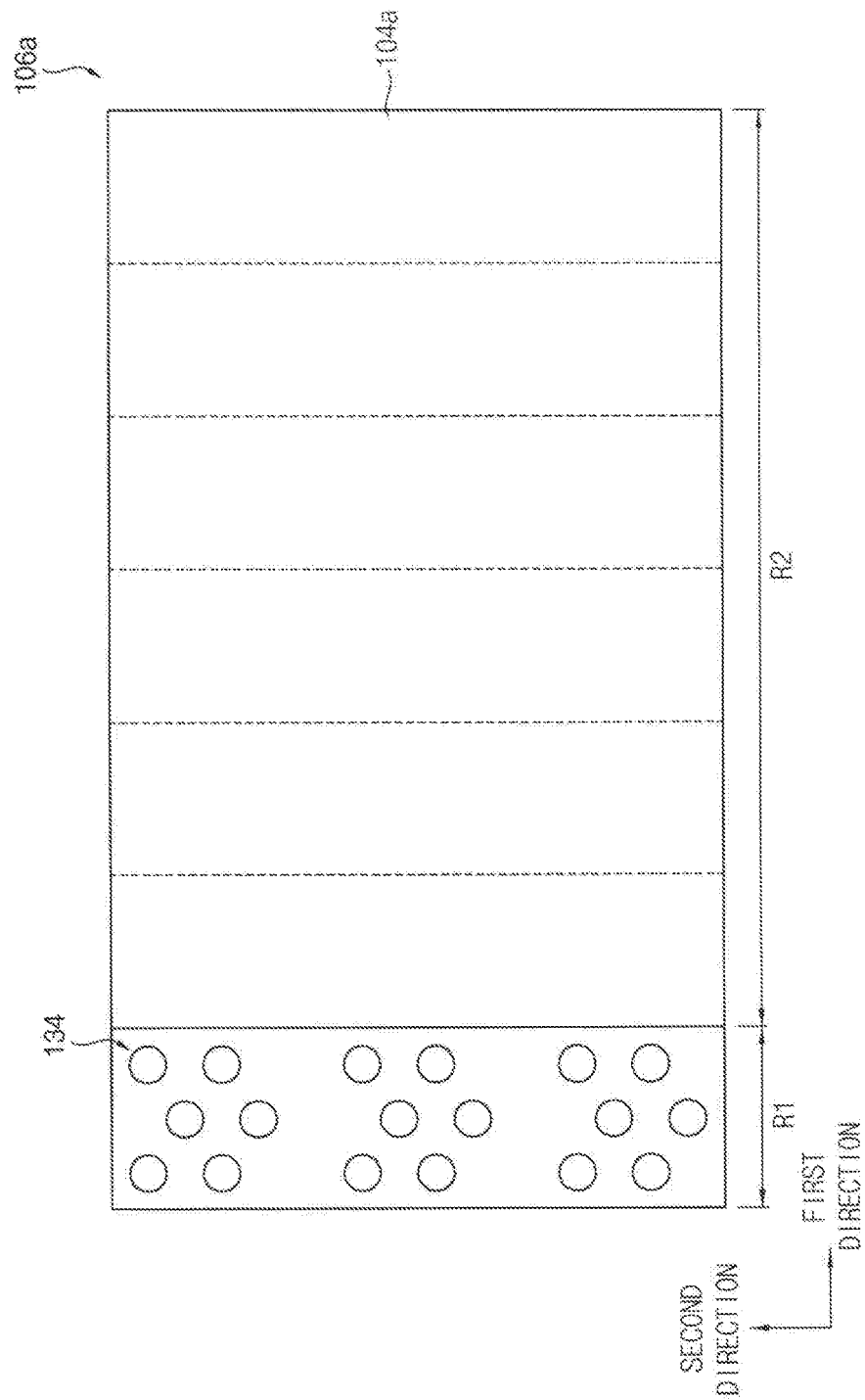
Figure 14:
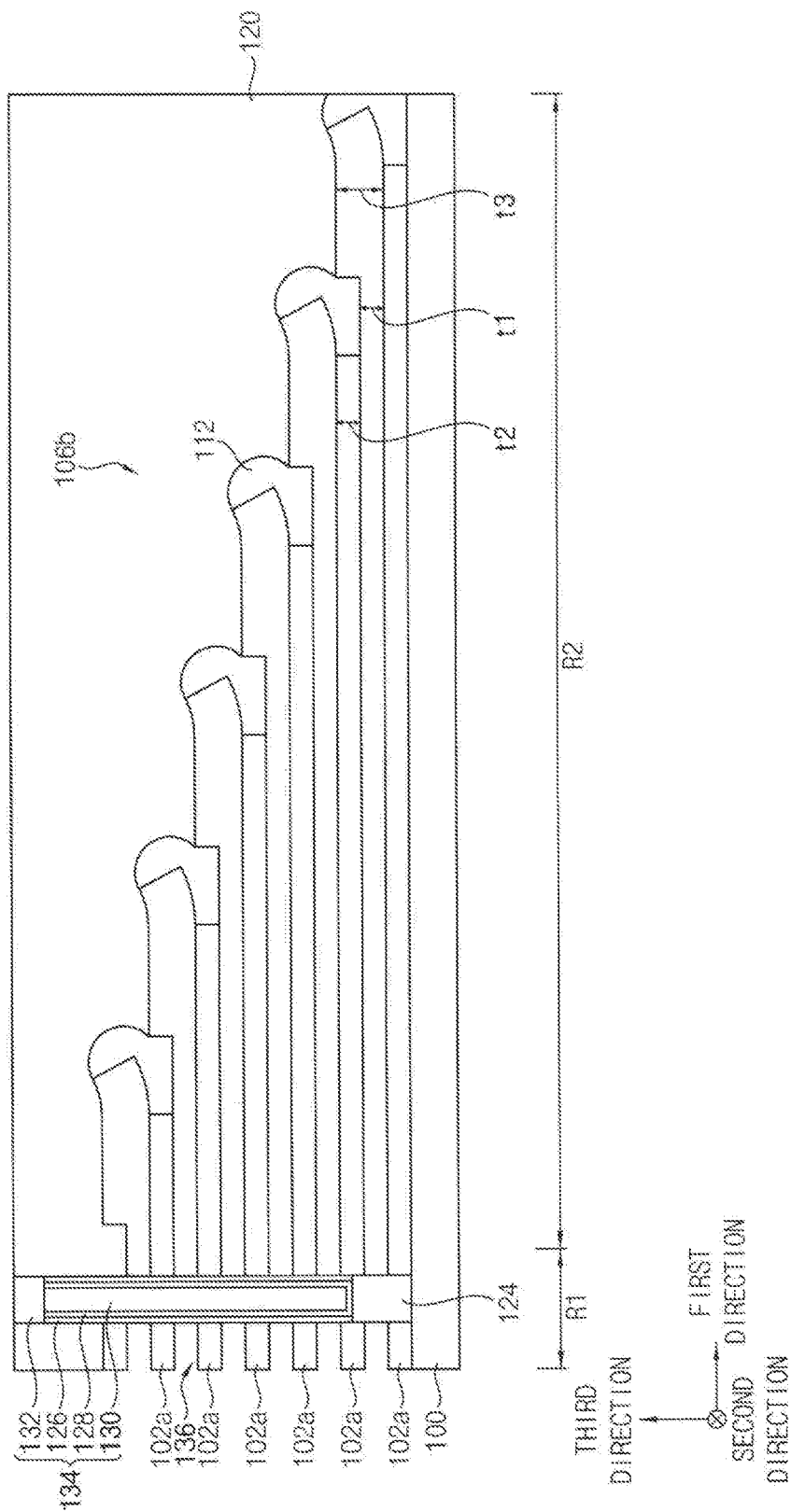
Figure 15:
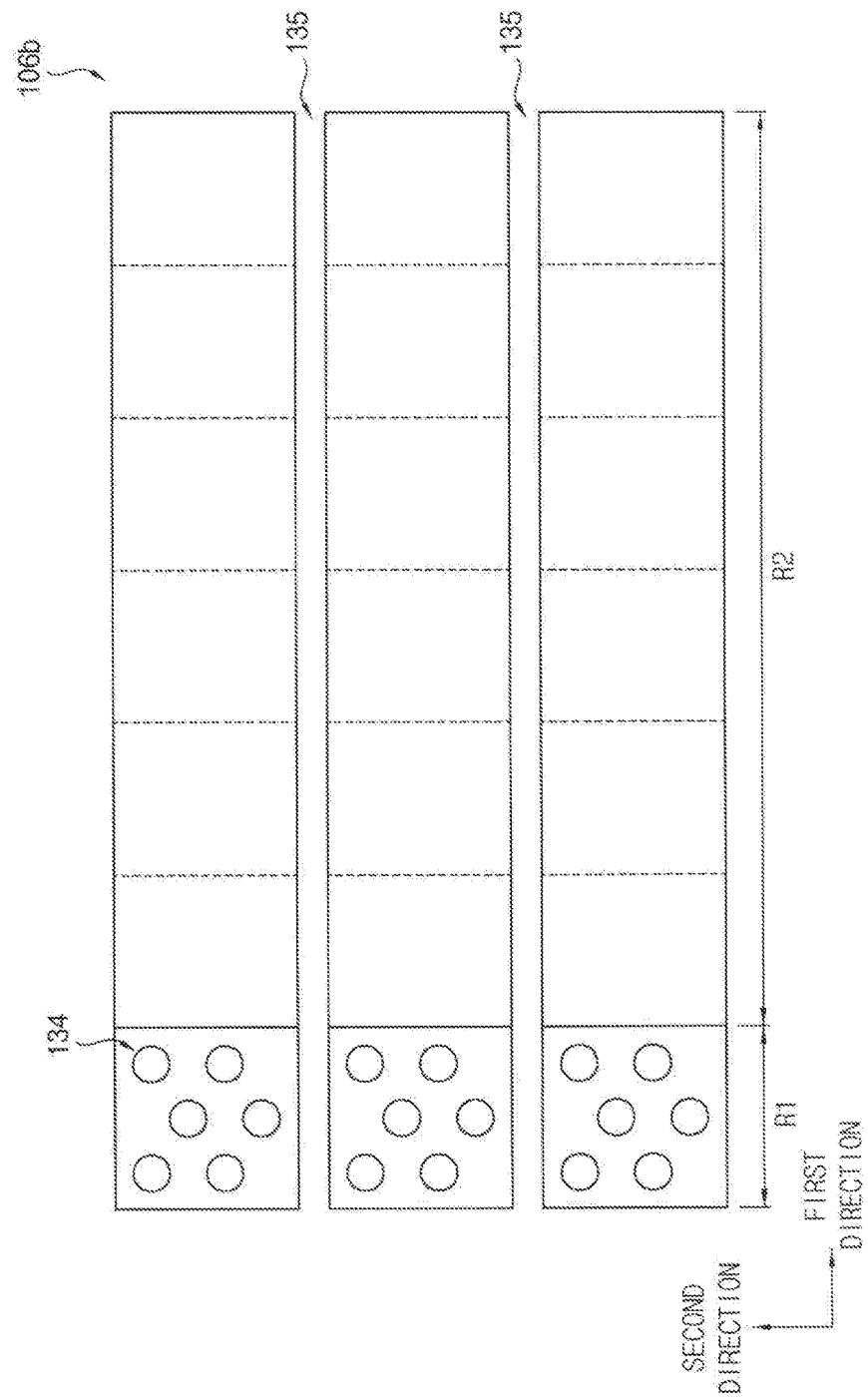

In particular, FIGS. 13 and 15 are plan views, and FIGS. 4 to 12, 14, 16 and 18 are plan views.

Figure 4:
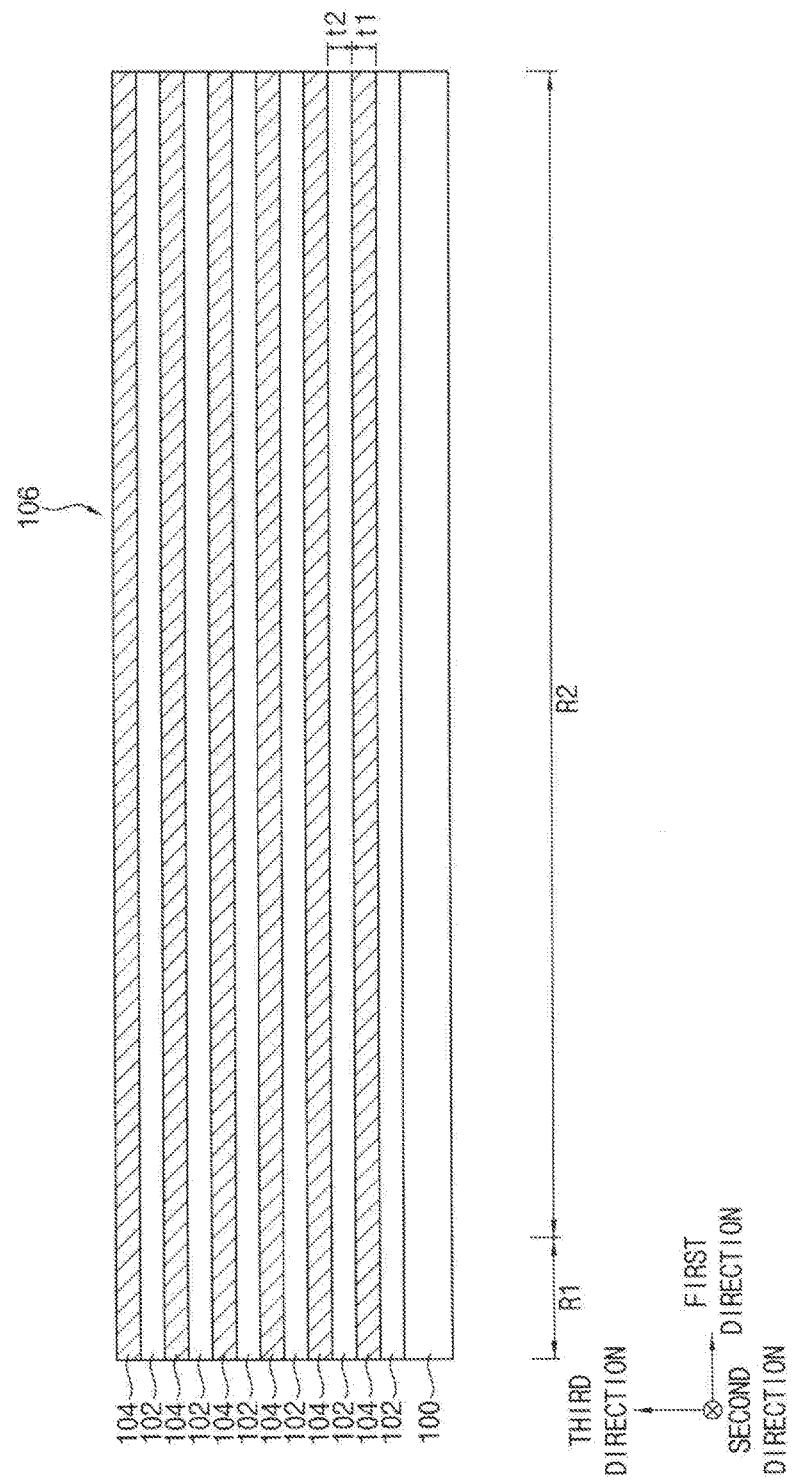
FIGS. 4 to 18 are cross-sectional views and plan views illustrating stages of a method of manufacturing a semiconductor device, in accordance with example embodiments.

Referring to FIG. 4, a preliminary mold structure 106 may be formed on first and second regions R1 and R2 of a substrate 100.

In particular, insulation layers 102 and sacrificial layers 104 may be alternatingly and repeatedly stacked on the substrate 100 to form the preliminary mold structure 106. In example embodiments, a lowermost insulation layer 102 may serve as a pad insulation layer.

In example embodiments, the sacrificial layer 104 may have a first thickness t1 in the third direction, and the insulation layer 102 may have a second thickness t2 in the third direction.

In example embodiments, the insulation layers 102 may be formed of an oxide-based material, such as, for example, silicon oxide, SiC, SiOF, etc. In example embodiments, the sacrificial layers 104 may be formed of a nitride-based material, such as, for example, silicon nitride and/or silicon boron nitride.

Figure 5:
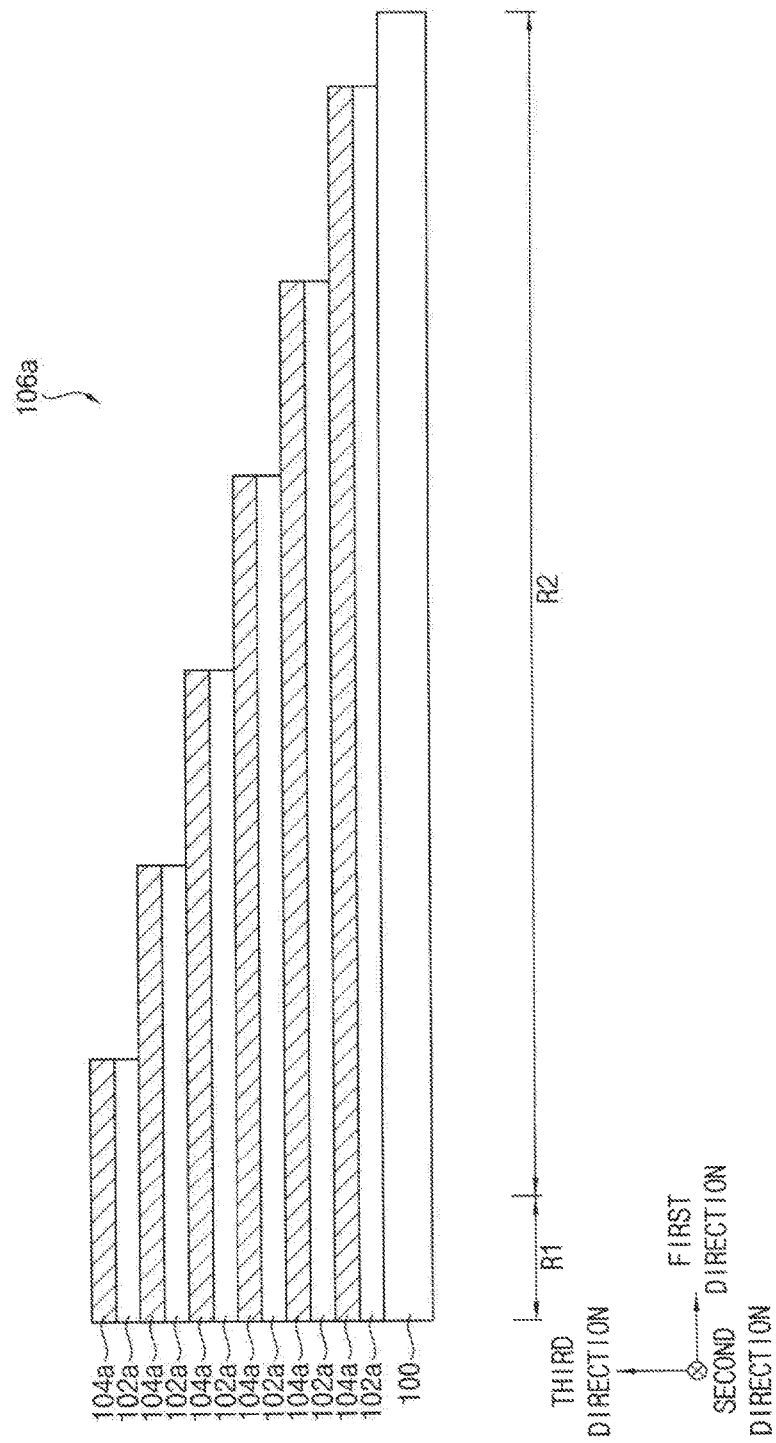

Referring to FIG. 5, edge portions of the preliminary mold structure 106 on the second region R2 may be sequentially etched to form a preliminary step mold structure 106a that includes insulation patterns 102a and sacrificial layer patterns 104a which are alternatingly and repeatedly stacked. In example embodiments, the preliminary step mold structure 106a on the second region R2 may have a staircase shape.

Each of steps in the preliminary step mold structure 106a may include one insulation pattern 102a and one sacrificial layer pattern 104a stacked thereon. In each step, the sacrificial layer pattern 104a may be exposed. Thus, a portion of each of the sacrificial layer patterns 104a that is not overlapped with ones of the sacrificial layer patterns 104a disposed thereover may be exposed.

In the preliminary step mold structure 106a formed on the second region R2, an edge upper surface and a sidewall of the sacrificial layer pattern 104a and a sidewall of the insulation pattern 102a may be exposed.

The sacrificial layer pattern 104a included in the preliminary step mold structure 106a on the first region R1 may be replaced with a first conductive pattern in a conductive pattern structure by subsequent processes.

The sacrificial layer pattern 104a included in the preliminary step mold structure 106a on the second region R2 may be replaced with into a second conductive pattern in a conductive pattern structure by subsequent processes.

Figure 6:
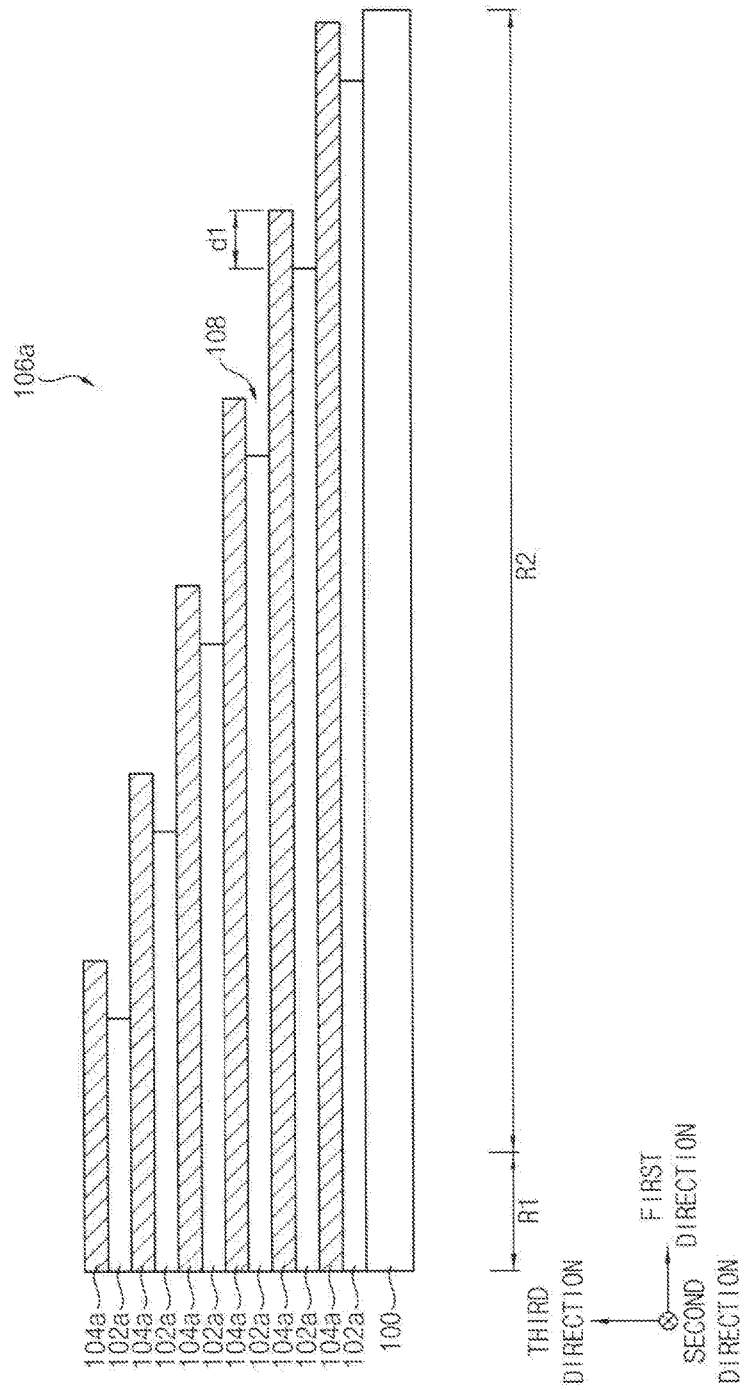

Referring to FIG. 6, a lateral portion of each of the insulation patterns 102a may be partially etched so as to form a recess 108.

The etching process for forming the recess 108 may include an isotropic etching process, such as, for example, a wet etching process or an isotropic dry etching process. In example embodiments, the insulation pattern 102a may be removed by using an etchant having an etching selectivity with respect to silicon nitride. For example, the etchant may include hydrofluoric acid (HF).

The recess 108 may be formed between the sacrificial layer patterns 104a in an edge portion of the preliminary step mold structure 106a. In this aspect, the recess 108 may be defined by a sidewall of the insulation pattern 102a, an upper surface of an underlying sacrificial layer pattern 104a, and a lower surface of an overlying sacrificial layer pattern 104a.

In the recess 108, a distance in the first direction between an end of the overlying sacrificial layer pattern 104a and the sidewall of the insulation pattern 102a may be referred to as a depth d1 of the recess 108.

The exposed portion of each of the sacrificial layer patterns 104a may function as a step portion by a subsequent process. The step portion may include a first portion having a lower surface that is substantially flat and a second portion having upper and lower surfaces that are bent upwardly.

An edge of the sacrificial layer pattern 104a may not be supported by the insulation pattern 102a, and may protrude from the sidewall of the insulation pattern 102a in the first direction. The edge of the sacrificial layer pattern 104a may function as the second portion in the step portion by a subsequent process. As the depth d1 of the recess 108 increases, a length in the first direction of the second portion may increase. By controlling the depth d1 of the recess 108, the length in the first direction of the second portion may be controlled.

Depending on the depth d1 of the recess 108, a height of a bent portion of the sacrificial layer pattern 104a may be varied. By controlling the depth d1 of the recess 108, the height of the bent portion of the sacrificial layer pattern 104a may be controlled.

The step portion subsequently formed may include the first portion B1 having the lower surface that is substantially flat. In example embodiments, the depth d1 of the recess 108 may be less than a length in the first direction of the exposed portion of the sacrificial layer pattern 104a in the step portion.

Figure 7:
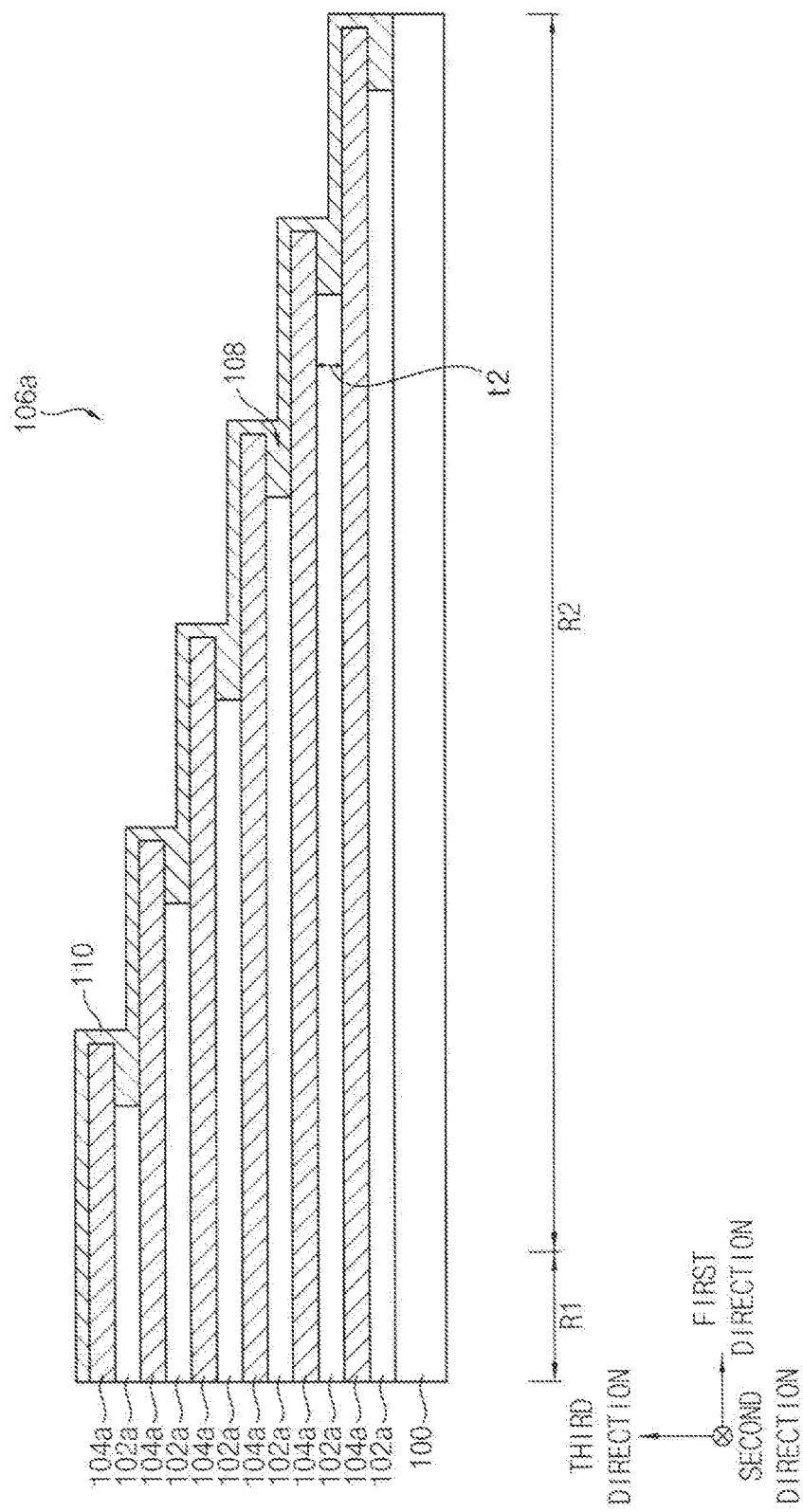
Figure 8:
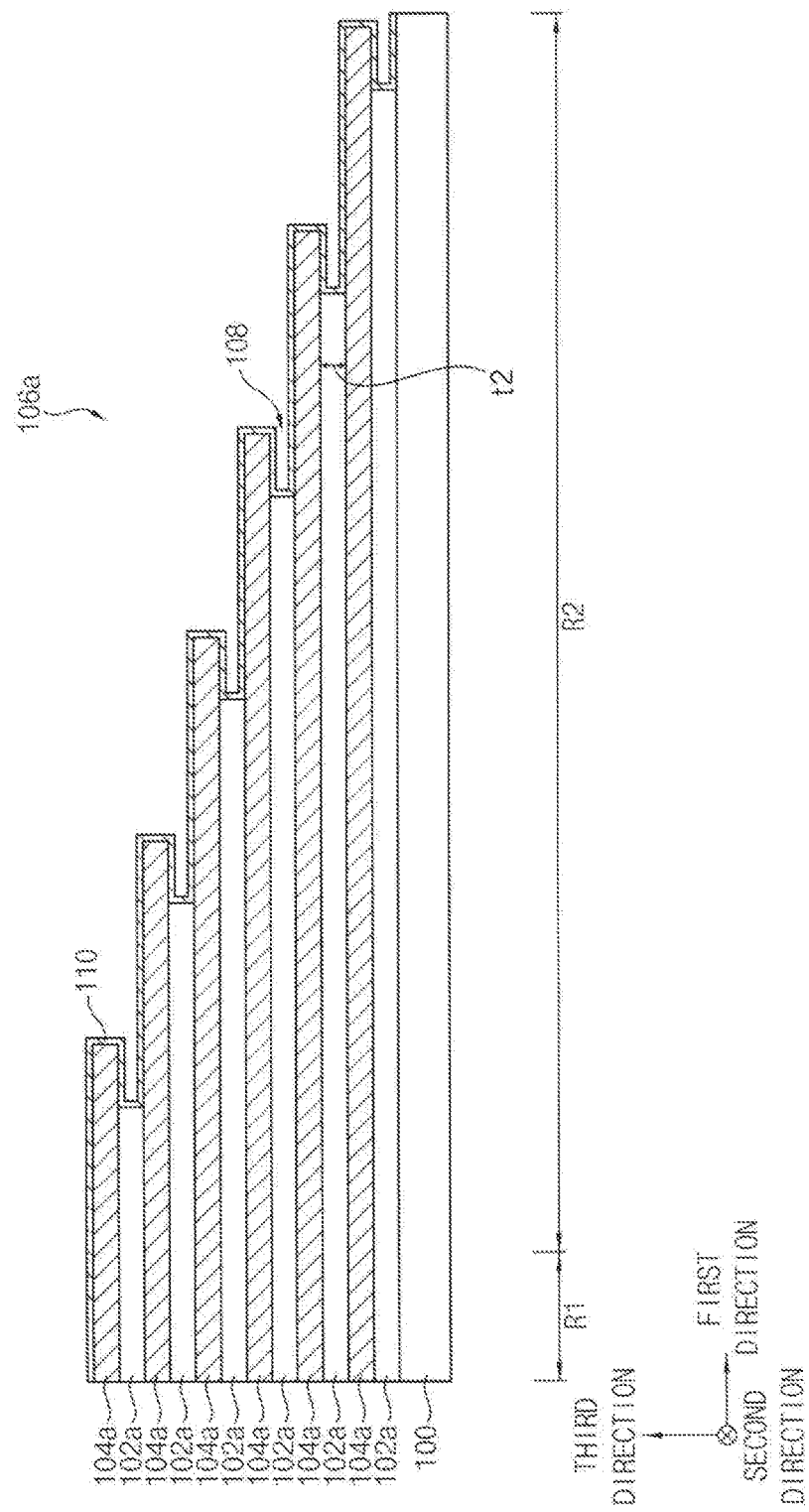

Referring to FIGS. 7 and 8, a polysilicon layer 110 may be conformingly formed on a surface of the preliminary step mold structure 106a.

In example embodiments, as shown in FIG. 7, the polysilicon layer 110 may be formed so as to completely fill the recesses 108. In this case, a thickness of the polysilicon layer 110 may be equal to or greater than a half of the second thickness t2.

In some example embodiments, as shown in FIG. 8, the polysilicon layer 110 may be formed along the surface of the recess 108 without completely filling the recess 108. In this case, the thickness of the polysilicon layer 110 may be less than a half of the second thickness t2.

The polysilicon layer 110 may be formed by a CVD (chemical vapor deposition) process or an ALD (atomic layer deposition) process.

Figure 9:
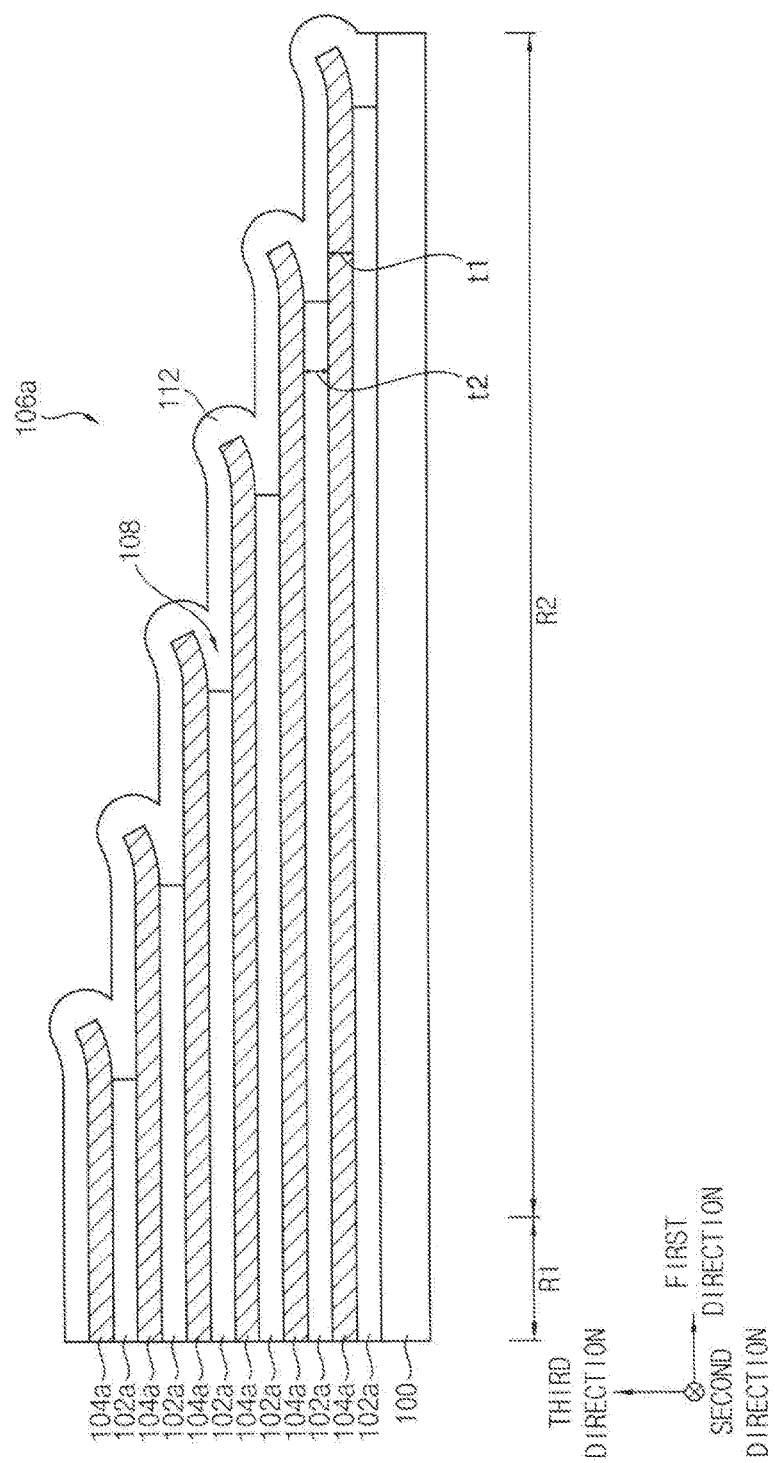

Referring to FIG. 9, the polysilicon layer 110 may be oxidized to form a silicon oxide layer 112. In the oxidation process, the sacrificial layer pattern 104a may not be oxidized. In this aspect, the sacrificial layer pattern 104a may serve as an oxidation blocking layer.

The oxidation process may include a wet oxidation process or a dry oxidation process. For example, the wet oxidation process may be performed at a temperature lower than about 800° C.

In example embodiments, the polysilicon layer 110 may be entirely oxidized to form the silicon oxide layer 112. Thus, the silicon oxide layer 112 may completely fill the recess 108. The silicon oxide layer 112 may cover an upper surface of the exposed portion of the sacrificial layer pattern 104a and a sidewall of the sacrificial layer pattern 104a.

As the silicon oxide layer 112 may be formed by the oxidation of the polysilicon layer 110, a thickness of the silicon oxide layer 112 may be greater than a thickness of the polysilicon layer 110. When the silicon oxide layer 112 is formed, a bird's beak effect may occur, thereby increasing a likelihood that a volume expansion may occur in the third direction and a great stress may be generated. Thus, a portion of the sacrificial layer pattern 104a on the silicon oxide layer 112 may be bent upward, so that heights of upper and lower surfaces of the sacrificial layer pattern 104a may increase. In particular, the portion of the sacrificial layer pattern 104a protruding from a sidewall of the insulation pattern 102a in the first direction may be bent so as to be higher.

A thickness of the silicon oxide layer 112 covering the upper surface and the sidewall of the sacrificial layer pattern 104a may be greater than a thickness of the polysilicon layer 110. In example embodiments, the thickness of the polysilicon layer 110 may be equal to or greater than the second thickness t2. In some example embodiments, the thickness of the polysilicon layer 110 may be less than the second thickness t2.

After performing the above processes, the thickness of the sacrificial layer pattern 104a may not be substantially changed. In particular, the sacrificial layer pattern 104a may have the first thickness t1 in the third direction.

Figure 10:
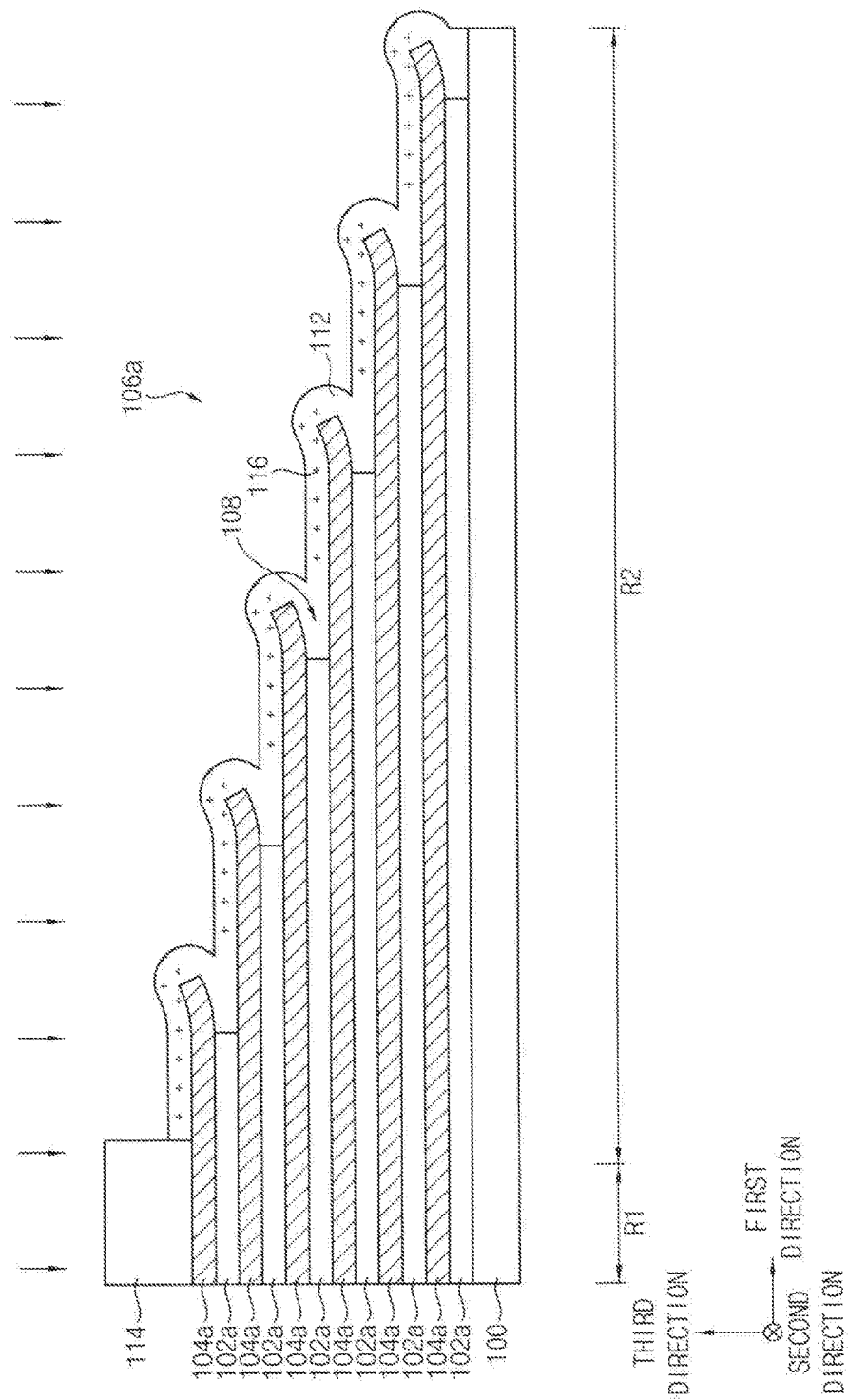

Referring to FIG. 10, a mask pattern 114 may be formed on the silicon oxide layer 112 so as to cover a portion of the preliminary step mold structure 106a on the first region R1. The silicon oxide layer 112 on the second region R2 may be exposed by the mask pattern 114. A surface treatment may be performed on an upper surface of the silicon oxide layer 112, such that the silicon oxide layer 112 may be damaged.

The surface treatment may include an impurity implantation process. In example embodiments, the impurity implantation process may include an ion implantation process. The impurity may be implanted so as to damage the silicon oxide layer, so that a conductive type of the impurities may not be limited. The impurity may include, for example, any of boron, arsenic, phosphorus, etc.

The silicon oxide layer 112 may cover the sacrificial layer pattern 104a having the step shape. An etch rate of a treated portion 116 of the silicon oxide layer 112 may be different from an etch rate of a non-treated portion of the silicon oxide layer 112. In example embodiments, the etch rate of the treated portion 116 of the silicon oxide layer 112 may be higher than the etch rate of the non-treated portion of the silicon oxide layer 112 in the same etching condition.

The insulation pattern 102a may not be exposed, so that the insulation pattern 102a may not be damaged by the surface treatment. Thus, an etch rate of the insulation pattern 102a may be different from the etch rate of the treated portion 116 of the silicon oxide layer 112.

When the impurity is implanted in a direction that is perpendicular to the surface of the substrate 100, the impurity may not be implanted into a portion of the silicon oxide layer 112 on the sidewall of the sacrificial layer pattern 104a. Further, the impurity may not be implanted into a portion of the silicon oxide layer 112 filling the recess 108. Thus, the portion of the silicon oxide layer 112 on the sidewall of the sacrificial layer pattern 104a and the portion of the silicon oxide layer 112 filling the recess 108 may not be damaged.

The mask pattern 114 may be removed.

Referring to FIG. 11, an upper insulating interlayer 120 may be formed on the silicon oxide layer 112 so as to cover the preliminary step mold structure 106a. An upper surface of the upper insulating interlayer 120 may be higher than an upper surface of the preliminary step mold structure 106a. The upper surface of the upper insulating interlayer 120 may be substantially flat.

In example embodiments, the upper insulating interlayer 120 may be formed by depositing an oxide layer including, for example, any of silicon oxide, SiOC, SiOF, etc., and planarizing an upper surface of the oxide layer. The planarization process may include a chemical mechanical polishing (CMP) process and/or an etch back process.

Referring to FIGS. 12 and 13, the preliminary step mold structure 106a and the upper insulating interlayer 120 on the first region R1 may be anisotropically etched to form a plurality of channel holes 122 which respectively expose upper surfaces of the substrate 100. The channel holes 122 may be formed through the preliminary step mold structure 106a and the upper insulating interlayer 120. A plurality of channel structures 134 may be formed in the channel holes 122, respectively.

In example embodiments, before forming the channel structure 134, a semiconductor pattern 124 may be further formed under the channel structure 134, and the semiconductor pattern 124 may be in contact with the substrate 100. In particular, the semiconductor pattern 124 may be formed by a selective epitaxial growth (SEG) process using a top surface of the substrate 100 exposed by the channel hole 122 as a seed. The channel structure 134 may be formed on the semiconductor pattern 124 so as to fill the channel hole 122.

In example embodiments, the channel structure 134 may include a dielectric structure 126, a channel 128, a filling insulation pattern 130 and an upper conductive pattern 132. The dielectric structure 126 may include a tunnel insulation layer, a charge storage layer and a blocking dielectric layer which are sequentially stacked on the channel. The upper conductive pattern 132 may be formed on the dielectric structure 126, the channel 128 and the filling insulation pattern 130. The upper conductive pattern 132 may be formed of, e.g., polysilicon.

In some example embodiments, a dummy channel structure (not shown) may be further formed through the preliminary step mold structure 106a and the upper insulating interlayer 120 on the second region R2. When the channel structure 134 is formed on the first region R1, the dummy channel structure may be also formed on the second region R2. Thus, the channel structure 134 and the dummy channel structure may be substantially the same stacked structure.

Referring to FIGS. 14 and 15, the preliminary step mold structure 106a and the upper insulating interlayer 120 may be anisotropically etched to form an opening 135 that extends in the first direction. Thus, the preliminary step mold structure 106a may be divided into separate pieces to form a step mold structure 106b between adjacent openings 135. An upper surface of the substrate 100 may be exposed by the opening 135.

A portion of the step mold structure 106b on the first region R1 may be replaced with a conductive pattern structure by subsequent processes. A portion of the step mold structure 106b on the first region R2 may be replaced with a pad structure by subsequent processes.

Impurities may be implanted onto the upper surface of the substrate 100 exposed by the opening 135 to form an impurity region (not shown). The impurities may include n-type impurities, such as, for example, phosphorus, arsenic, etc.

The sacrificial layer pattern 104a exposed by the opening 135 and the treated portion 116 of the silicon oxide layer 112 may be removed by an isotropic etching process. The isotropic etching process may include a wet etching process or an isotropic dry etching process. In the wet etching process, an etchant may include hydrofluoric acid (HF). In the isotropic dry etching process, an etching gas may include ammonia ($NH_3$).

In the isotropic etching process, the sacrificial layer pattern 104a may be entirely removed, and the treated portion 116 of the silicon oxide layer 112 exposed by removing the sacrificial layer pattern 104a may be also removed.

By removing the sacrificial layer pattern 104a and the treated portion 116 of the silicon oxide layer 112, a gap 136 may be formed between the insulation patterns 102a in the third direction.

A first gap formed by removing only the sacrificial layer pattern 104a may have the first thickness t1 in the third direction. A second gap formed by removing the sacrificial layer pattern 104a and the treated portion 116 of the silicon oxide layer 112 may have the third thickness t3 in the third direction which is greater than the first thickness t1.

Figure 16:
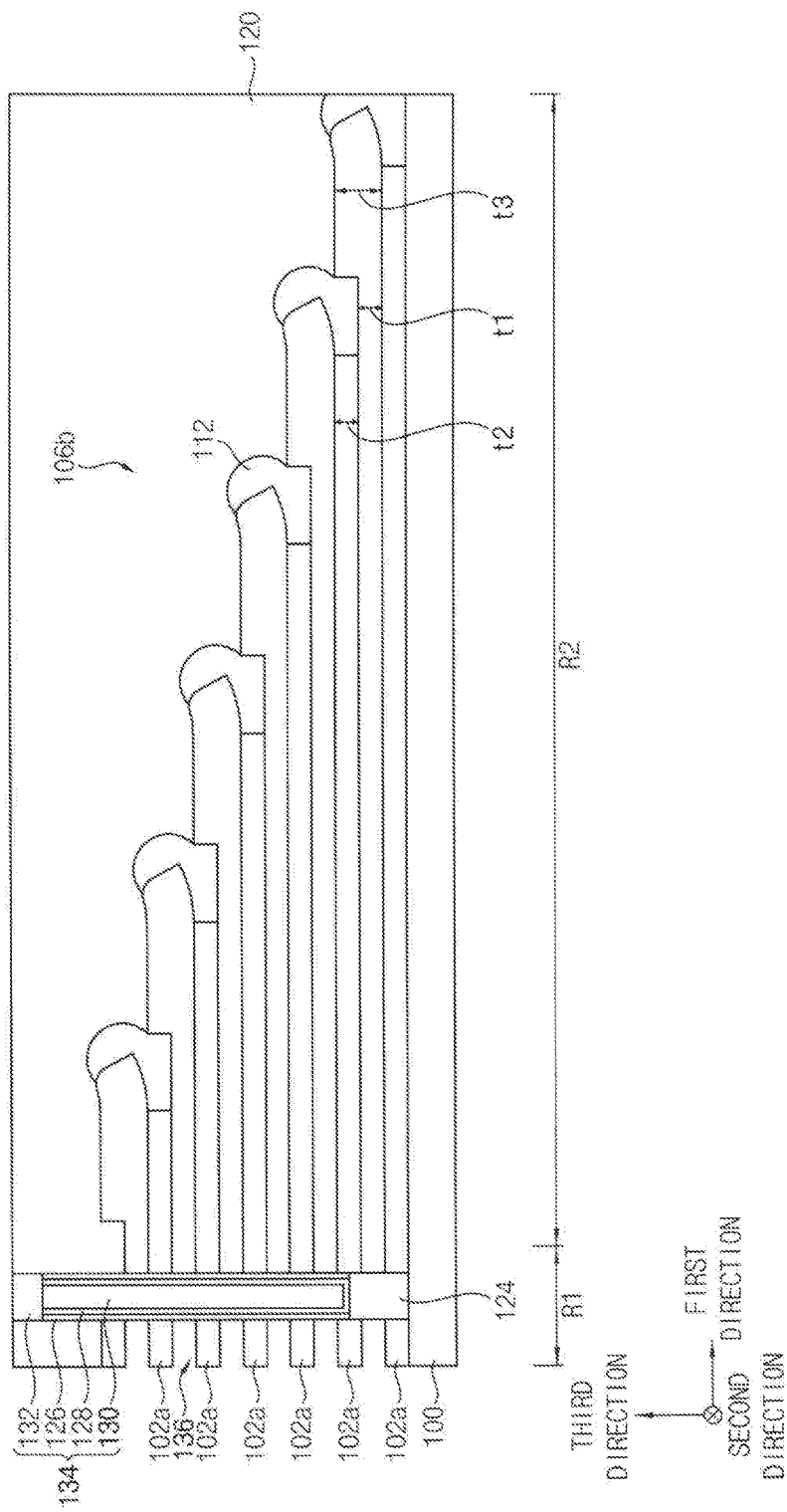

In example embodiments, a thickness and a shape of the gap 136 may vary according to a concentration of the impurities in the silicon oxide layer 112 and a thickness of the silicon oxide layer 112. In some example embodiments, as shown in FIG. 16, a portion of the silicon oxide layer 112 on an edge of the sacrificial layer pattern 104a may have a relatively low concentration of the impurities. Thus, a portion of the gap 136 formed by the edge of the sacrificial layer pattern 104a may have a thickness less than the third thickness t3. In this case, the semiconductor device shown in FIG. 3 may be manufactured by subsequent processes.

Figure 17:
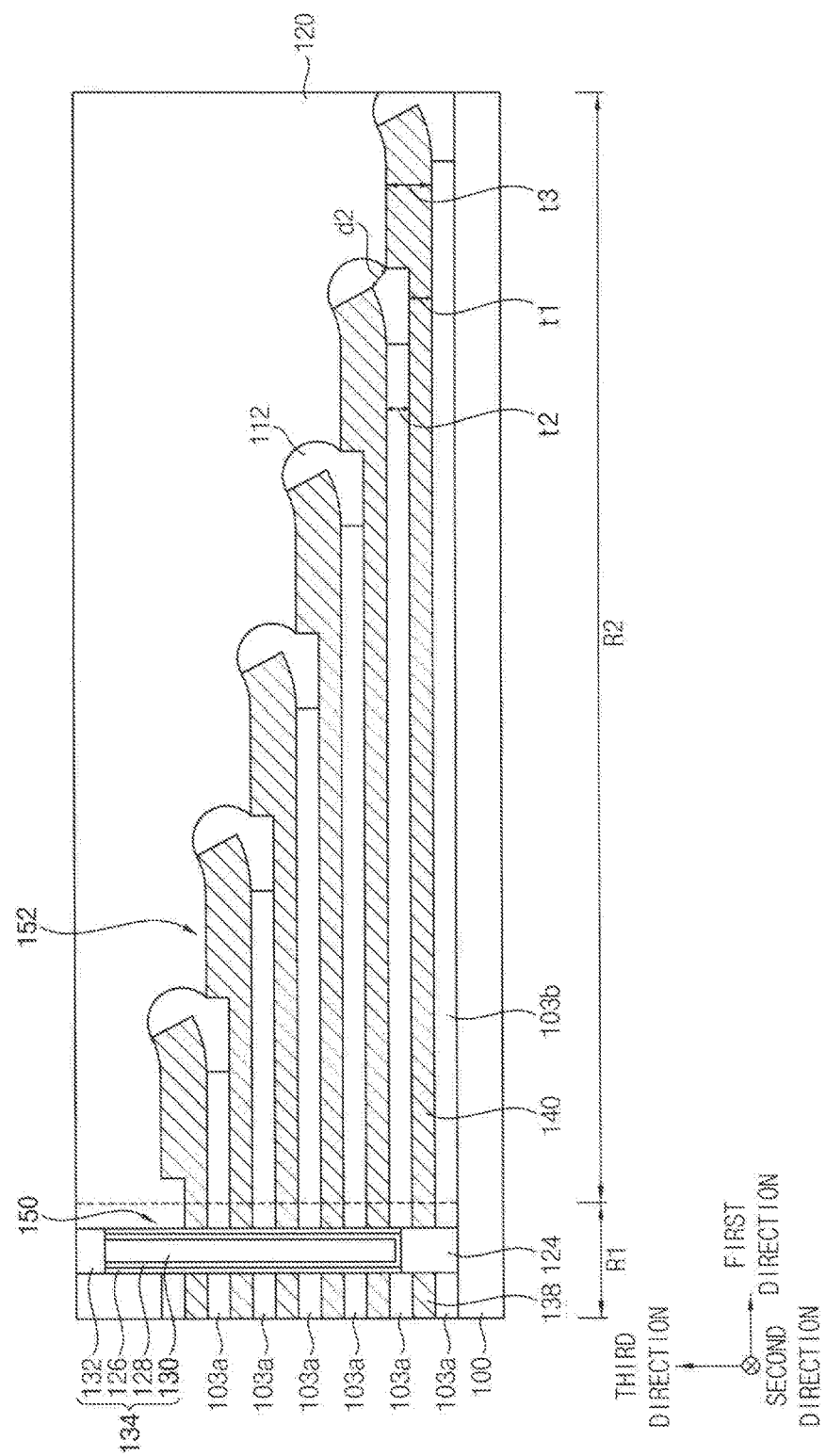

Referring to FIG. 17, a conductive material may fill the gap 136 to form a first conductive pattern 138 on the first region R1 and a second conductive pattern 140 on the second region R2.

Thus, a conductive pattern structure 150 that includes the first conductive patterns 138 and the first insulation patterns 103a in an alternatingly stacked arrangement may be formed on the first region R1. Further, a pad structure 152 that includes the second conductive patterns 140 and the second insulation patterns 103b in an alternatingly stacked arrangement and having a staircase shape may be formed on the second region R2.

Each of the first and second conductive patterns 138 and 140 may include a metal. In example embodiments, each of the first and second conductive patterns 138 and 140 may include a metal pattern and a barrier metal pattern. The metal pattern may include, for example, any of tungsten, copper, cobalt, aluminum, etc., and the barrier pattern may include, for example, any of titanium, titanium nitride, tantalum, tantalum nitride, etc.

The first conductive pattern 138 may have the first thickness t1 in the third direction.

Edge portions of the second conductive patterns 140 may have a staircase shape in the first direction. Each of the second conductive patterns 140 may include an extension portion A (referring to FIG. 2) and a step portion B (referring to FIG. 2). In each of the second conductive patterns 140, the extension portion A may have the first thickness t1 in the third direction, and the step portion B may have the third thickness t3 in the third direction. In the step portion B, the second conductive patterns 140 may not overlap each other in the third direction.

Referring also to FIG. 2, the step portion B may include a first portion B1 that has a substantially flat surface and a second portion B2 that has a bent surface. In particular, a lower surface of the second conductive pattern in the first portion B1 may be substantially flat. Lower and upper surfaces of the second conductive pattern 140 may be bent upwardly.

As described above, in the second conductive pattern 140, the step portion B may have a thickness that is greater than a thickness of the extension portion A. The lower surfaces of the first portion B1 and the extension portion A may be coplanar with each other. The lower surface of the second portion B2 may be higher than the lower surfaces of the first portion B1 and the extension portion A. The upper surface of the extension portion A may be lower than the upper surface of the step portion B. In the step portion B, the upper surface of the first portion B1 may be lower than the upper surface of the second portion B2.

As the thickness of the step portion B is increased, a distance between the second conductive patterns 140 in the step portion B may decrease. Thus, an electrical short circuit between the second conductive patterns 140 in the third direction may occur.

However, in example embodiments, as the upper and lower surfaces of the second portion B2 may be bent upwardly, a distance d2 between the second conductive patterns 140 of the step portion B may increase.

Figure 18:
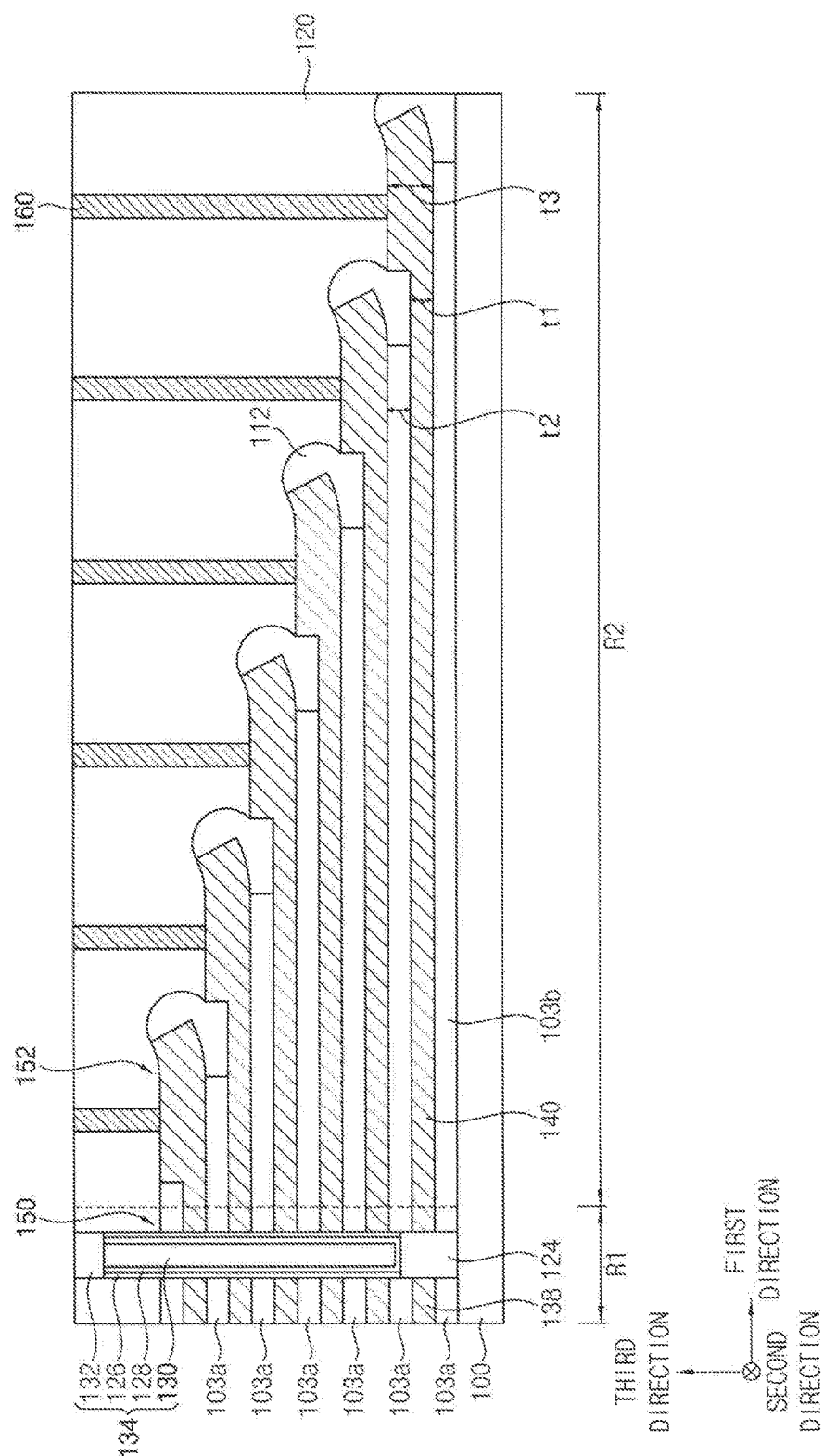

Referring to FIG. 18, contact plugs 160 may be formed on the second conductive patterns 140 in the pad structure 152, respectively, through the upper insulating interlayer 120. In example embodiments, the contact plugs 160 may be in contact with an upper surface of the first portion B1 in the step portion B.

In particular, the upper insulating interlayers 120 and the second insulation pattern may be etched to form a contact hole so as to expose each of the second conductive patterns 140 in the pad structure 152. A barrier layer may be formed on an inner wall of the contact hole, and a metal layer may be formed on the barrier layer to fill the contact hole. The metal layer and the barrier layer may be planarized until the upper insulating interlayer 120 may be exposed.

When a thickness of the step portion B is thin, the contact plug 160 may not be easily formed on a target one of the second conductive patterns 140. Thus, the contact plug 160 may pass through the target one of the second conductive patterns 140, and may make contact with another one of the second conductive patterns 140 thereunder.

However, in example embodiments, as the thickness of the step portion B may be relatively thick, the contact plug 160 may be easily formed on the target one of the second conductive patterns 140.

A wiring line (not shown) which is electrically connected to the contact plug 160 may be formed on the upper insulating interlayer 120. The wiring line may extend in the second direction.

FIGS. 19 to 23 are cross-sectional views illustrating stages of a method of manufacturing a semiconductor device, in accordance with example embodiments.

This method may be substantially the same as or similar to those illustrated in FIGS. 4 to 18, except for forming the second conductive patterns.

First, processes described above with reference to FIGS. 4 to 9 may be performed.

Figure 19:
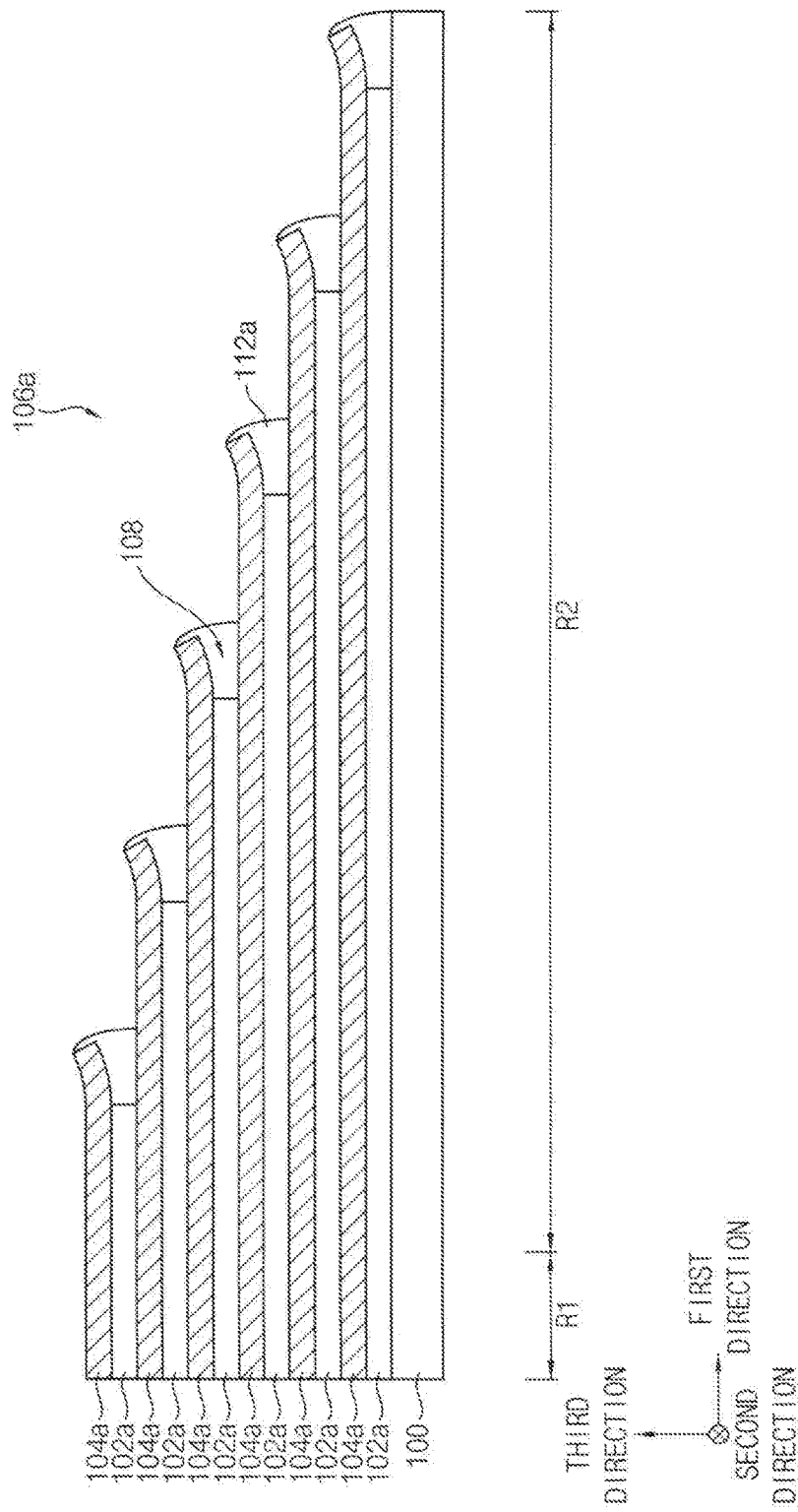
FIGS. 19 to 23 are cross-sectional views illustrating stages of a method of manufacturing a semiconductor device, in accordance with example embodiments.

Referring to FIG. 19, the silicon oxide layer 112 that covers the preliminary mold structure 106a may be anisotropically etched to form a spacer 112a. The anisotropic etching process may include a dry etching process. The spacer 112a may fill the recess 108 and may cover a sidewall of the sacrificial layer pattern 104a.

When the silicon oxide layer 112 is anisotropically etched, an upper surface of the sacrificial layer pattern 104a of the step portion may be exposed. During the anisotropic etching process, the silicon oxide layer 112 on the sidewall of the sacrificial layer pattern 104a may be hardly etched.

Figure 20:
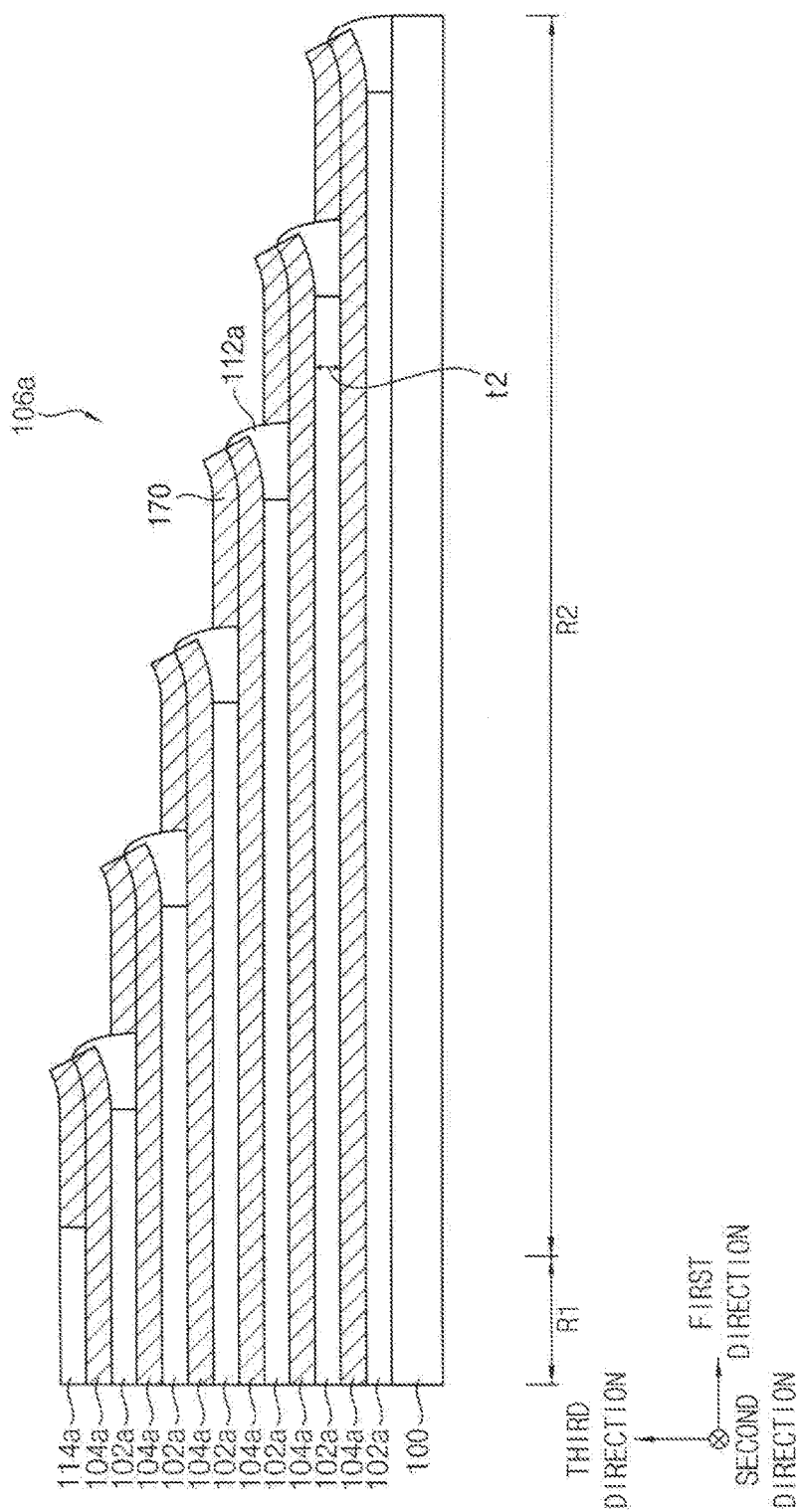

Referring to FIG. 20, a mask pattern 114a may be formed so as to cover the preliminary step mold structure 106a on the first region R1. A second sacrificial layer 170 may be selectively formed on the exposed portion of the sacrificial layer pattern 104a by a selective deposition process in which a layer may be deposited only on a specific underlying layer. In this aspect, the second sacrificial layer 170 may not be formed on underlying layers except for the sacrificial layer pattern 104a. The second sacrificial layer 170 may be formed of a material that is substantially the same as a material of the sacrificial layer pattern 104a. In example embodiments, the second sacrificial layer 170 may be formed of, for example, any of silicon nitride, silicon oxynitride, etc.

The preliminary step mold structure 106a on the second region R2 may have a staircase shape. The preliminary step mold structure 106a on the second region R2 may include a first portion in which the upper and lower sacrificial layer patterns 104a may overlap with each other and a second portion in which the upper and lower sacrificial layer patterns 104a may not overlap with each other. The second sacrificial layer 170 may be formed on the second portion of the sacrificial layer pattern 104a, and the second sacrificial layer 170 may be in contact with a lower sidewall of the spacer 112a.

A thickness of the second conductive pattern 140 in the step portion may vary according to a thickness of the second sacrificial layer 170.

In example embodiments, a thickness of the second sacrificial layer 170 may be greater than the second thickness t2 of the insulation pattern 102a. In some example embodiments, a thickness of the second sacrificial layer 170 may be less than the second thickness t2.

The mask pattern 114a covering the preliminary step mold structure 106a on the first region R1 may be removed.

In example embodiments, the second sacrificial layer 170 may not be easily deposited on an edge portion of the sacrificial layer pattern 104a. Thus, a portion of the second sacrificial layer 170 formed on the edge portion of the sacrificial layer pattern 104a may be relatively thin. In this case, a thickness of the edge portion of the sacrificial layer pattern 104a may be less than the third thickness t3. Thus, the semiconductor device shown in FIG. 3 may be manufactured by subsequent processes.

Figure 21:
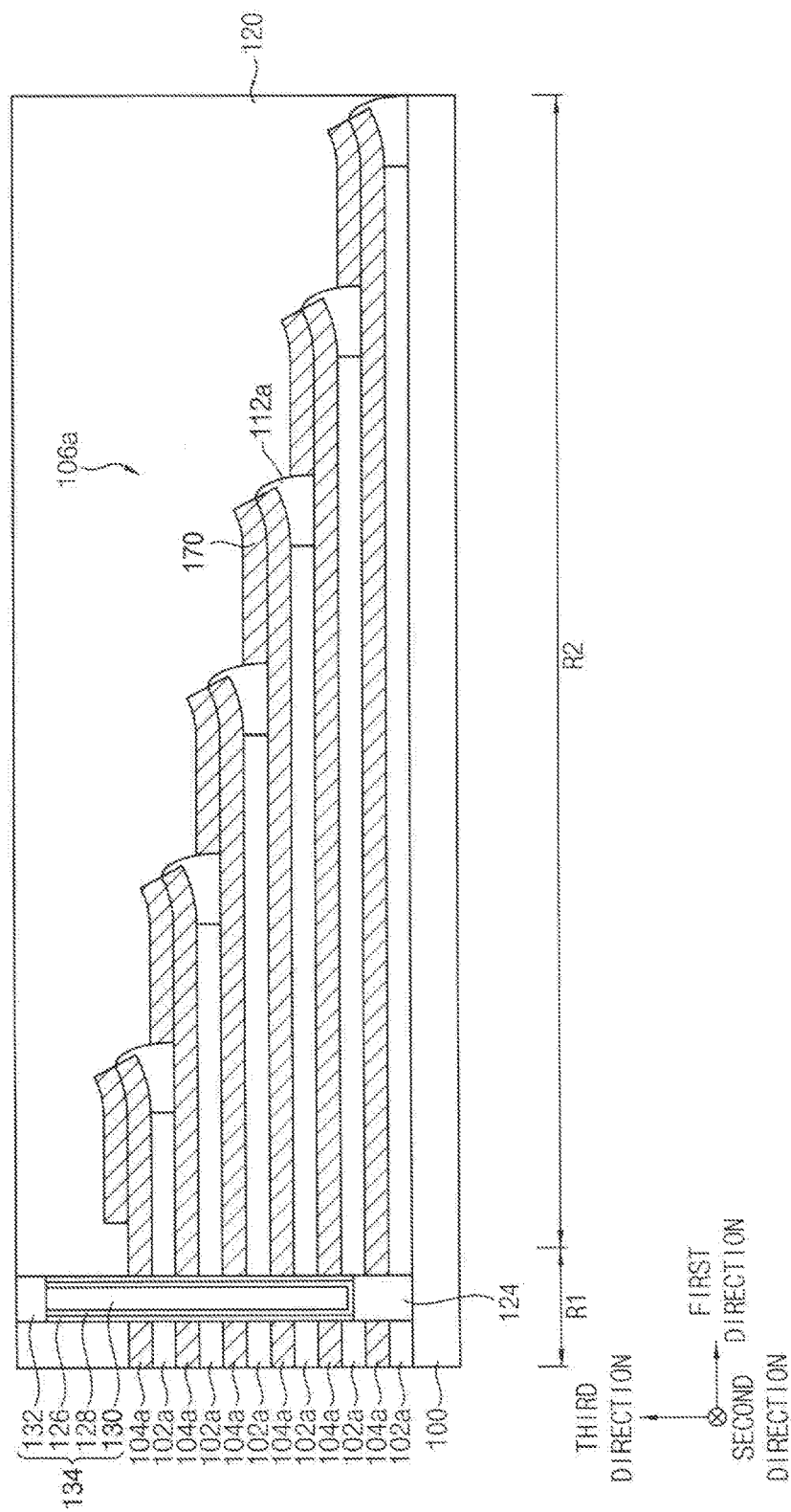

Referring to FIG. 21, an upper insulating interlayer 120 may be formed so as to cover the preliminary step mold structure 106a. A plurality of channel structures 134 may be formed through the preliminary step mold structure 106a and the upper insulating interlayer 120 in the first region R1.

The processes may be substantially the same as those described above with reference to FIGS. 11 to 13.

Figure 22:
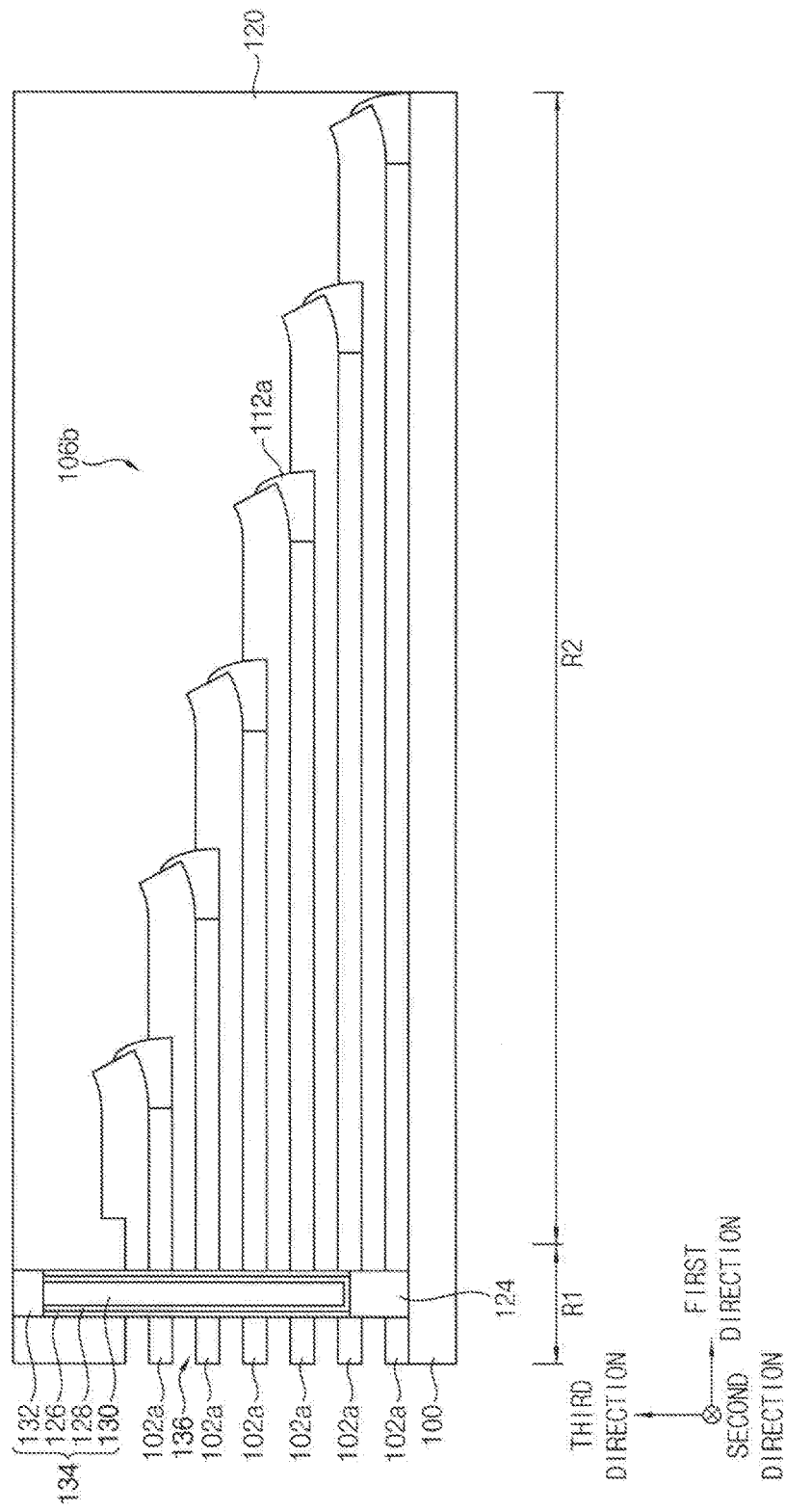

Referring to FIG. 22, the preliminary step mold structure 106a may be etched to form an opening that extends in the first direction. Impurities may be implanted onto the substrate 100 exposed by the opening so as to form an impurity region (not shown). The impurities may include n-type impurities, such as, for example, phosphorus, arsenic, etc.

The sacrificial layer pattern 104a exposed by the opening and the second sacrificial layer 170 may be removed by an isotropic etching process. Thus, a gap 136 may be formed between the insulation patterns 102a in the third direction.

Figure 23:
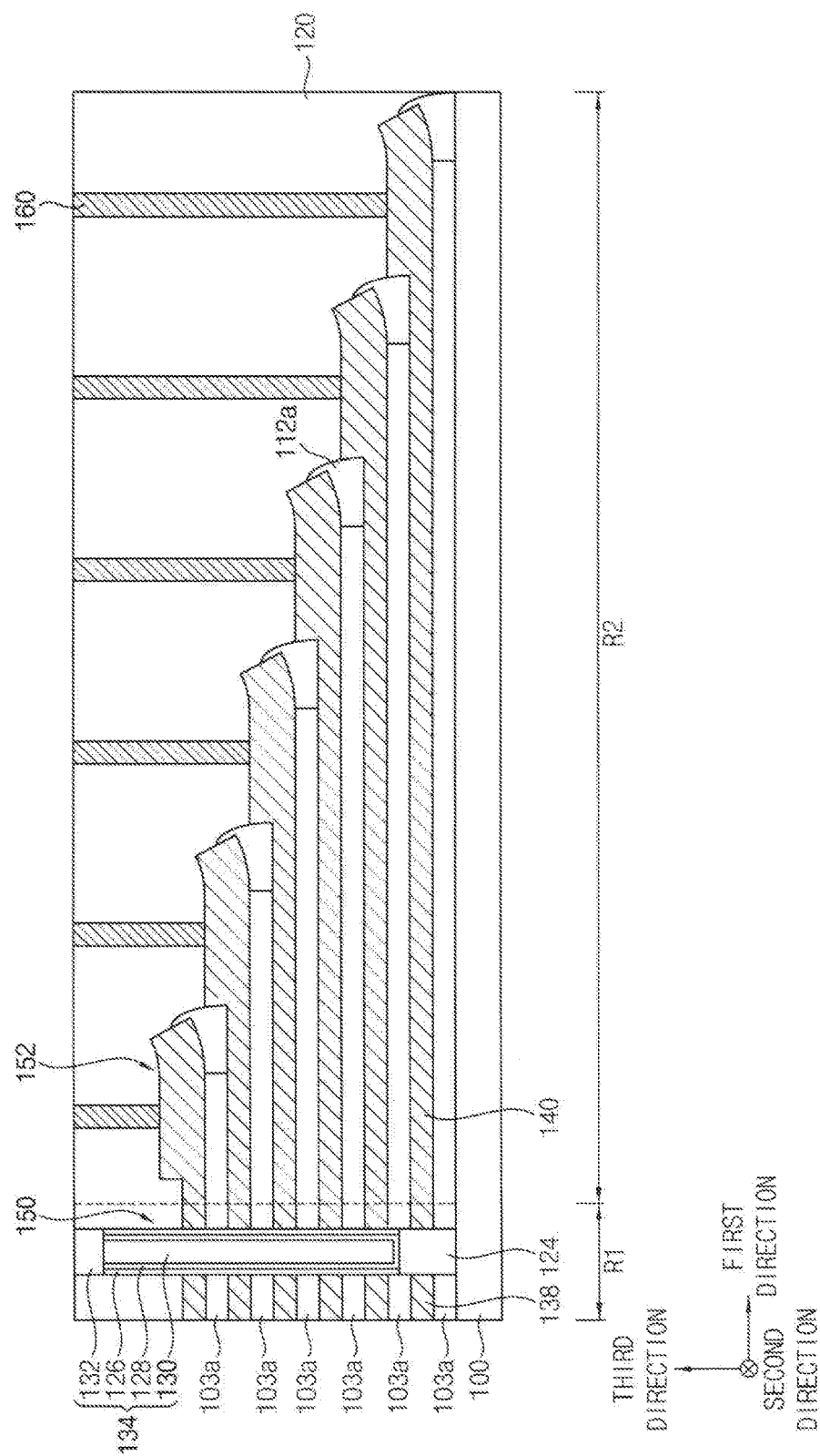

Processes described above as illustrated in FIGS. 17 and 18 may be performed so that a semiconductor device shown in FIG. 23 may be manufactured.

Referring to FIG. 23, the semiconductor device may include the spacer 112a that includes silicon oxide on a sidewall and an edge lower portion of the second conductive pattern 140. The spacer 112a may fill a recess between adjacent second conductive layers 140 in the third direction. The spacer 112a may cover a lower sidewall of the second conductive pattern 140 in the step portion.

Figure 24:
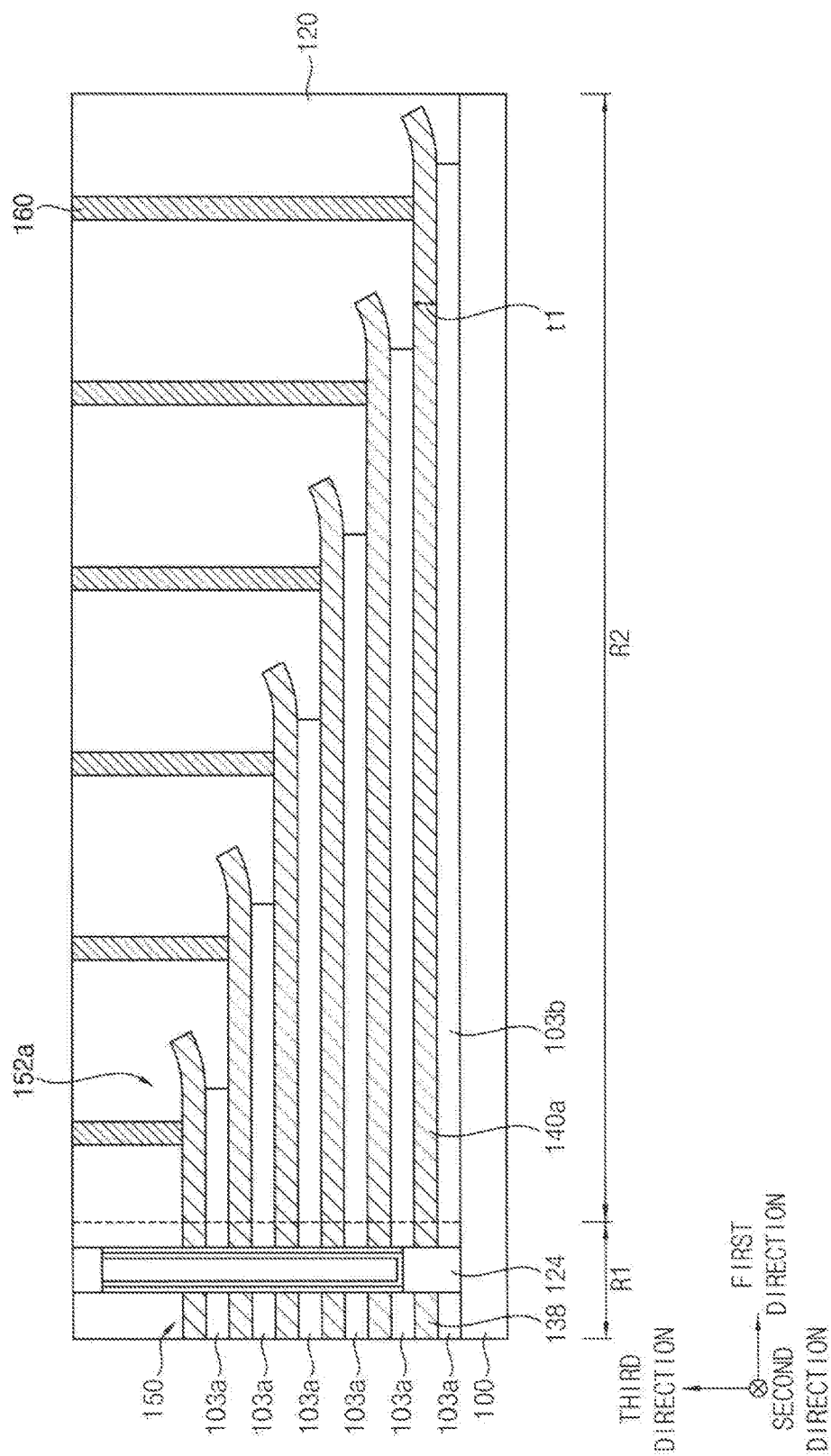
FIG. 24 is a cross-sectional view illustrating a semiconductor device, in accordance with example embodiments.
Figure 25:
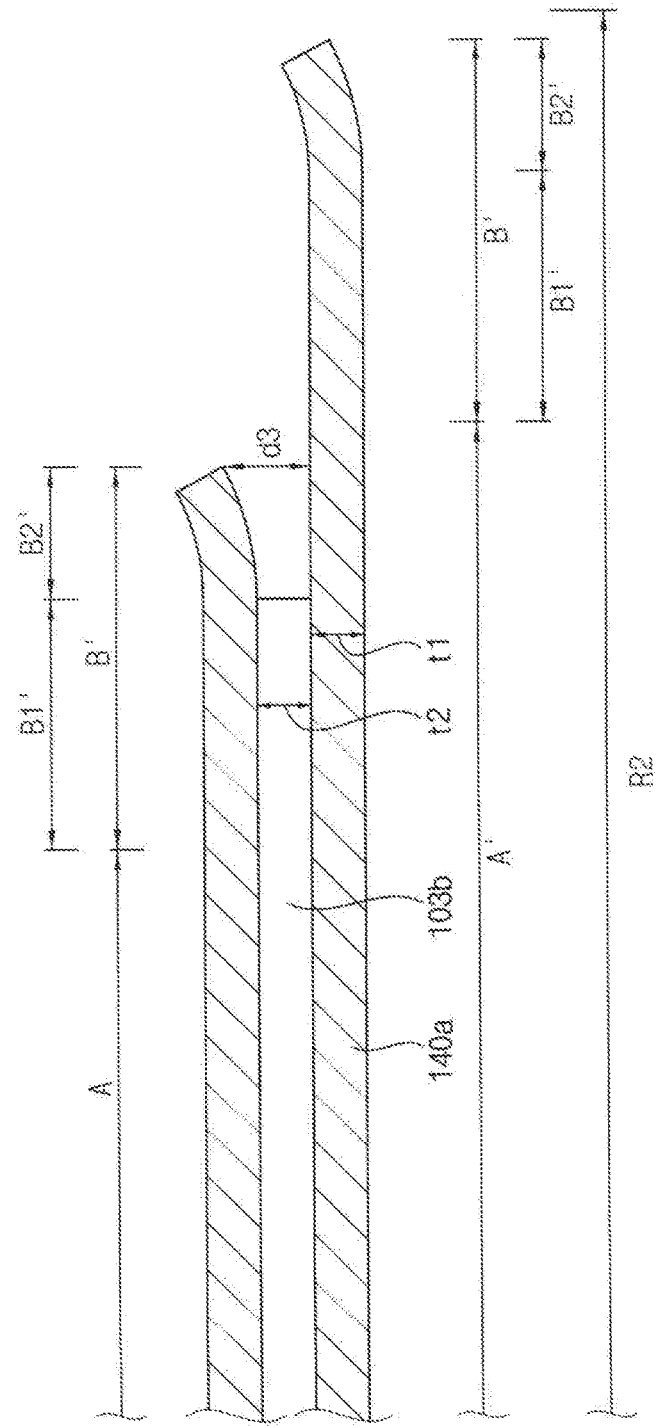
FIG. 25 is a cross-sectional view illustrating a portion of a pad structure in the semiconductor device, in accordance with example embodiments.

FIG. 24 is a cross-sectional view illustrating a semiconductor device, in accordance with example embodiments. FIG. 25 is a cross-sectional view illustrating a portion of a pad structure in the semiconductor device, in accordance with example embodiments.

The semiconductor device of FIG. 24 may be substantially the same as the semiconductor device illustrated in FIG. 1, except for the shape of the second conductive pattern in the pad structure.

Referring to FIGS. 24 and 25, thicknesses of the first and second conductive patterns 138 and 140a may be substantially equal to each other.

In particular, the first conductive pattern 138 may have the first thickness t1. The second conductive pattern 140a may include a step portion B' and an extension portion A'. Each of the step portion B' and the extension portion A' may have the first thickness t1.

In the second conductive pattern 140a, the upper surface and the lower surface of the step portion B' may not be substantially flat. In the step portion, portions of the upper surface and the lower surface of the step portion B' may be bent upwardly, and other portions of the upper surface and the lower surface of the step portion B' may be substantially flat. Similarly as illustrated in FIG. 1, the step portion B' may include the first portion B1' having a lower surface that is substantially flat and the second portion B2' having an upper surface that is bent upwardly.

Figure 26:
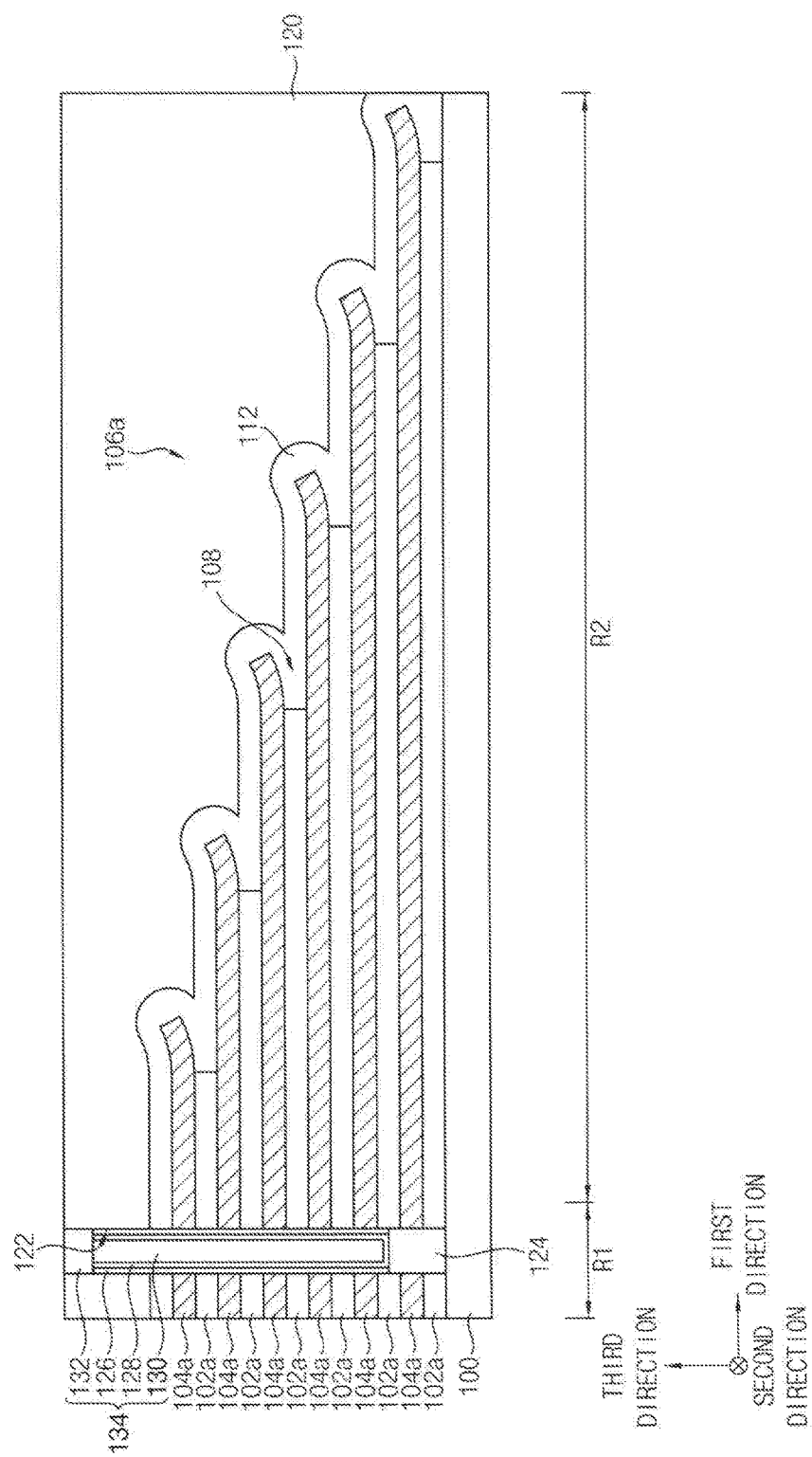
FIGS. 26 and 27 are cross-sectional views illustrating a method of manufacturing a semiconductor device, in accordance with example embodiments.
Figure 27:
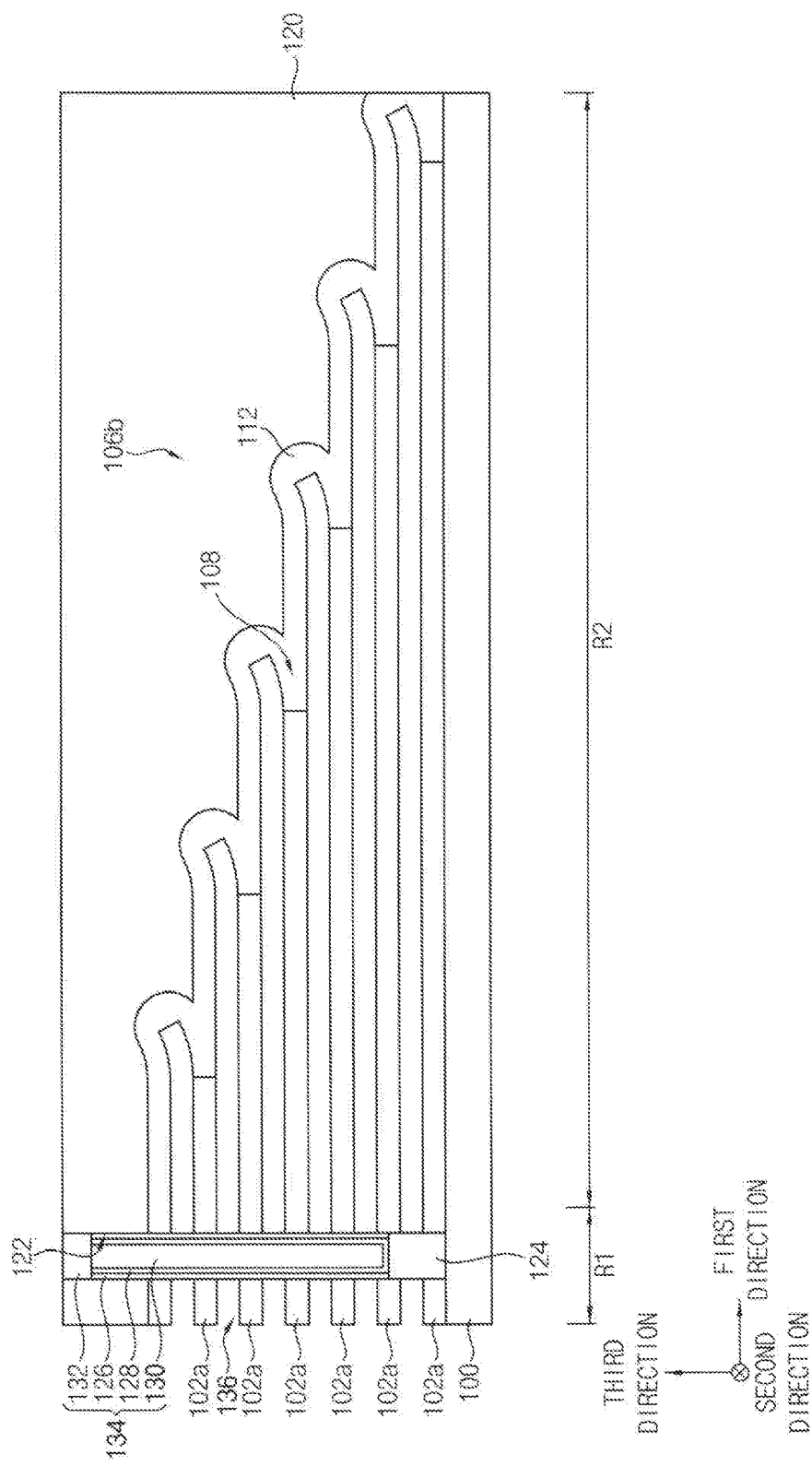

FIGS. 26 and 27 are cross-sectional views illustrating a method of manufacturing a semiconductor device, in accordance with example embodiments.

This method may be substantially the same as the method illustrated with reference to FIGS. 4 to 18, except for some processes.

First, processes as described above with reference to FIGS. 4 to 9 may be performed, however, a surface treatment process as described above with reference to FIG. 10 may not be performed.

Referring to FIG. 26, the upper insulating interlayer 120 may be formed on the silicon oxide layer so as to cover the preliminary step mold structure 106a. An upper surface of the upper insulating interlayer 120 may be higher than an upper surface of the preliminary step mold structure 106a. The upper surface of the upper insulating interlayer 120 may be substantially flat.

Process for forming the upper insulating interlayer 120 may be substantially the same as the process described above with reference to FIG. 11.

Referring to FIG. 27, processes as described above with reference to FIGS. 12 to 15 may be performed.

In particular, the channel structure 134 may be formed through the preliminary step mold structure 106a and the upper insulating interlayer 120. The preliminary step mold structure 106a may be etched to form the openings that extend in the first direction. Thus, the step mold structure 106b may be formed between adjacent openings. The sacrificial layer pattern 104a exposed by the opening may be removed by an etching process. In example embodiments, the etching process may include an isotropic etching process.

As the surface treatment process is not performed on the silicon oxide layer 112, the silicon oxide layer 112 may not be etched by the etching process.

The gap 136 between adjacent insulation patterns 102a in the third direction may be formed by the removing the sacrificial layer patterns 104a. The gap 136 may have the first thickness t1 in the third direction.

Processes as described above with reference to FIGS. 17 and 18 may be performed, and the semiconductor device shown in FIG. 24 may be manufactured.

The foregoing is illustrative of example embodiments and is not to be construed as limiting thereof. Although a few example embodiments have been described, persons having ordinary skill in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
a plurality of conductive patterns disposed on a substrate, each of the plurality of conductive patterns being spaced apart from each other in a vertical direction that is perpendicular to an upper surface of the substrate, each of the plurality of conductive patterns having an extension portion and a step portion, the step portion being disposed at an edge of a corresponding one of the plurality of conductive patterns; and
an insulation pattern disposed between each of the plurality of conductive patterns in the vertical direction,
wherein a lower surface of the step portion and an upper surface of the step portion of each of the plurality of conductive patterns are bent upwardly, and
wherein the extension portion has a first thickness and the step portion has a second thickness that is different from the first thickness.

2. The semiconductor device of claim 1, wherein a first length of the insulation pattern is less than a second length of each of the plurality of conductive patterns that adjoins the insulation pattern.

3. The semiconductor device of claim 1, wherein a recess is defined by a sidewall of the insulation pattern, an upper surface of a first one of the plurality of conductive patterns that is in contact with a lower surface of the insulation pattern and a lower surface of a second one of the plurality of conductive patterns that is in contact with an upper surface of the insulation pattern, and
wherein the semiconductor device further comprises a silicon oxide layer that is disposed on a sidewall of the second one of the plurality of conductive patterns and fills the recess.

4. The semiconductor device of claim 1, wherein a lower surface of the extension portion and an upper surface of the extension portion of each of the plurality of conductive patterns are substantially flat.

5. The semiconductor device of claim 1, wherein the second thickness is greater than the first thickness.

6. The semiconductor device of claim 1, wherein the step portion includes a first portion that has a flat lower surface and a second portion that has a bent lower surface that is bent upwardly.

7. The semiconductor device of claim 1, further comprising:
an upper insulating interlayer that covers a stack structure that includes each of the plurality of conductive patterns and the insulation pattern; and
a contact plug that extends through the upper insulating interlayer, and is in contact with the upper surface of the step portion of each of the plurality of conductive patterns.

8. The semiconductor device of claim 1, wherein a first distance between the edge and an adjacent conductive pattern of the plurality of conductive patterns is greater than a second distance between adjacent extension portions of the plurality of conductive patterns.

9. A semiconductor device comprising:
a conductive pattern structure disposed on a first region of a substrate, the conductive pattern structure including first conductive patterns and first insulation patterns that are alternatingly and repeatedly stacked; and
a pad structure disposed on a second region of the substrate, the pad structure including second conductive patterns and second insulation patterns that are alternatingly and repeatedly stacked,
wherein the first conductive patterns and the second conductive patterns in each level have a single first structure, and the first insulation patterns and the second insulation patterns in each level have a single second structure,
wherein each of the second conductive patterns includes an extension portion and a step portion, and the step portion is disposed at an edge of a corresponding one of the second conductive patterns,
wherein the extension portion has a first lower surface that is substantially flat and a first upper surface that is substantially flat, and the step portion has a second lower surface that is bent upwardly and a second upper surface that is bent upwardly, and
wherein the extension portion has a first thickness and the step portion has a second thickness that is different from the first thickness.

10. The semiconductor device of claim 9, further comprising a plurality of channel structures disposed on the substrate and extending through the conductive pattern structure, and each of the plurality of channel structures includes a dielectric layer structure, a channel, a filling insulation pattern, and an upper conductive pattern.

11. The semiconductor device of claim 9, wherein each of the first conductive patterns extends in a first direction and each of the second conductive patterns extends in the first direction.

12. The semiconductor device of claim 9, wherein a recess is defined by a sidewall of a first one of the second insulation patterns, an upper surface of a first one of the second conductive patterns that is in contact with a lower surface of the first one of the second insulation patterns, and a lower surface of a second one of the second conductive patterns that is in contact with an upper surface of the first one of the second insulation patterns, and
wherein the semiconductor device further comprises a silicon oxide layer that is disposed on a sidewall of the second one of the second conductive patterns and fills the recess.

13. The semiconductor device of claim 10, wherein the second thickness is greater than the first thickness.

14. The semiconductor device of claim 13, wherein each of the first conductive patterns has the first thickness.

15. The semiconductor device of claim 9, wherein an edge of the step portion is bent upwardly.

16. The semiconductor device of claim 9, further comprising:
an upper insulating interlayer disposed to cover a stack structure that includes the first conductive patterns, the second conductive patterns, the first insulation patterns, and the second insulation patterns; and
a contact plug that extends through the upper insulating interlayer, and is in contact with the upper surface of the step portion of each of the second conductive patterns.

17. A semiconductor device comprising:
a conductive pattern structure disposed on a first region of a substrate, the conductive pattern structure including first conductive patterns and first insulation patterns that are alternatingly and repeatedly stacked
a plurality of channel structures disposed on the substrate and extending through the conductive pattern structure; and
a pad structure disposed on a second region of the substrate, the pad structure including second conductive patterns and second insulation patterns that are alternatingly and repeatedly stacked,
wherein the first conductive patterns and the second conductive patterns in each level have a single first structure, and the first insulation patterns and the second insulation patterns in each level have a single second structure,
wherein each of the second conductive patterns includes an extension portion and a step portion, and a lower surface and an upper surface of an edge portion of the step portion are bent upwardly, and
wherein the extension portion has a first thickness and the step portion has a second thickness that is different from the first thickness.

18. The semiconductor device of claim 17, wherein a recess is defined by a sidewall of a first one of the second insulation patterns, an upper surface of a first one of the second conductive patterns that is in contact with a lower surface of the first one of the second insulation patterns, and a lower surface of a second one of the second conductive patterns that is in contact with an upper surface of the first one of the second insulation patterns, and
wherein the semiconductor device further comprises a silicon oxide layer that is disposed on a sidewall of the second one of the second conductive patterns and fills the recess.

19. The semiconductor device of claim 17, wherein each of the first conductive patterns has the first thickness, and
wherein the second thickness is greater than the first thickness.

* * * * *